(12) United States Patent
Kanegae et al.

(10) Patent No.: US 6,632,746 B2
(45) Date of Patent: Oct. 14, 2003

(54) ETCHING METHOD, SEMICONDUCTOR AND FABRICATING METHOD FOR THE SAME

(75) Inventors: Kenshi Kanegae, Takatsuki (JP); Shinichi Imai, Hirakata (JP); Hideo Nakagawa, Omihachiman (JP)

(73) Assignee: Matsushita Electric Industrial Co., Ltd. (JP)

( * ) Notice: Subject to any disclaimer, the term of this patent is extended or adjusted under 35 U.S.C. 154(b) by 41 days.

(21) Appl. No.: 09/837,556

(22) Filed: Apr. 19, 2001

(65) Prior Publication Data

US 2002/0061654 A1 May 23, 2002

(30) Foreign Application Priority Data

Apr. 19, 2000 (JP) .......................................... 2000-117680

(51) Int. Cl.⁷ ............................................. H01L 21/302
(52) U.S. Cl. ........................ 438/706; 438/723; 438/724
(58) Field of Search ................................. 438/706, 713, 438/714, 723, 725

(56) References Cited

U.S. PATENT DOCUMENTS

| | | | |
|---|---|---|---|
| 5,459,105 A | * 10/1995 | Matsuura | 438/699 |
| 5,780,163 A | 7/1998 | Camilletti et al. | |
| 5,814,563 A | * 9/1998 | Ding et al. | 438/714 |
| 5,817,572 A | * 10/1998 | Chiang et al. | 438/624 |
| 6,059,553 A | 5/2000 | Jin et al. | |
| 6,124,154 A | * 9/2000 | Miyasaka | 438/151 |
| 6,187,666 B1 | * 2/2001 | Singh et al. | 438/633 |
| 6,221,755 B1 | * 4/2001 | Tokumasu et al. | 438/623 |
| 6,228,751 B1 | * 5/2001 | Yamazaki et al. | 438/585 |
| 6,323,142 B1 | * 11/2001 | Yamazaki et al. | 438/790 |
| 6,451,504 B2 | * 9/2002 | Rolfson et al. | 430/272.1 |

FOREIGN PATENT DOCUMENTS

| | | |
|---|---|---|
| JP | 06-349788 | 12/1994 |
| JP | 8-316209 | 11/1996 |
| JP | 09-027472 | 1/1997 |
| JP | 9-153483 | 6/1997 |
| JP | 09-260350 | 10/1997 |
| JP | 10-107024 | 4/1998 |
| JP | 10-125654 | 5/1998 |
| JP | 10-178006 | 6/1998 |
| JP | 11-031678 | 2/1999 |
| WO | WO 99/21217 | 4/1999 |

* cited by examiner

*Primary Examiner*—Kin-Chan Chen
(74) *Attorney, Agent, or Firm*—Nixon Peabody LLP; Donald R. Studebaker LLP

(57) ABSTRACT

An organic/inorganic hybrid film represented by $SiC_xH_yO_z$ ($x>0$, $y\geq0$, $z>0$) is plasma-etched with an etching gas containing fluorine, carbon and nitrogen. During the etching, a carbon component is eliminated from the surface portion of the organic/inorganic hybrid film due to the existence of the nitrogen in the etching gas, to thereby reform the surface portion. The reformed surface portion is nicely plasma-etched with the etching gas containing fluorine and carbon.

23 Claims, 26 Drawing Sheets

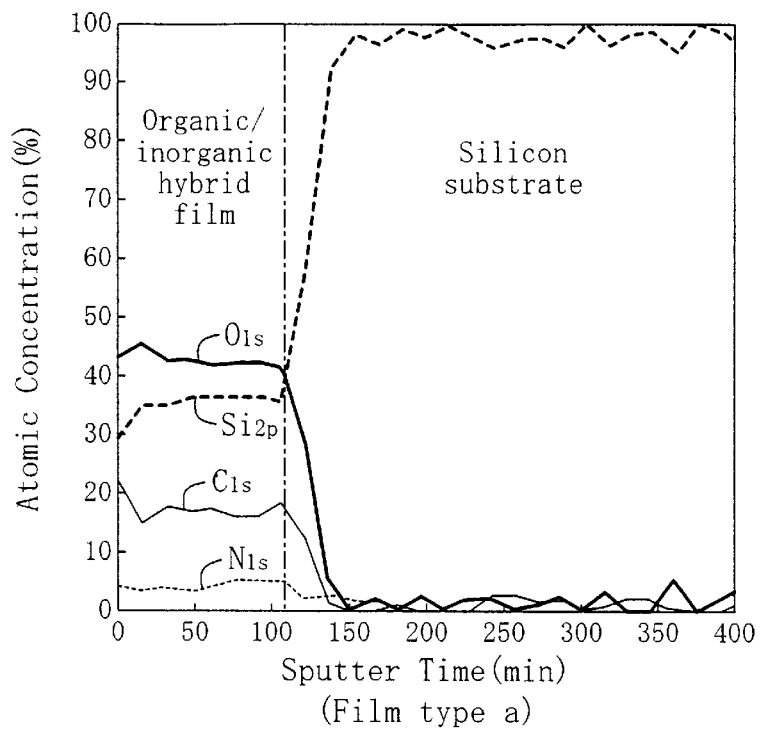
FIG. 5(a) (Film type a)
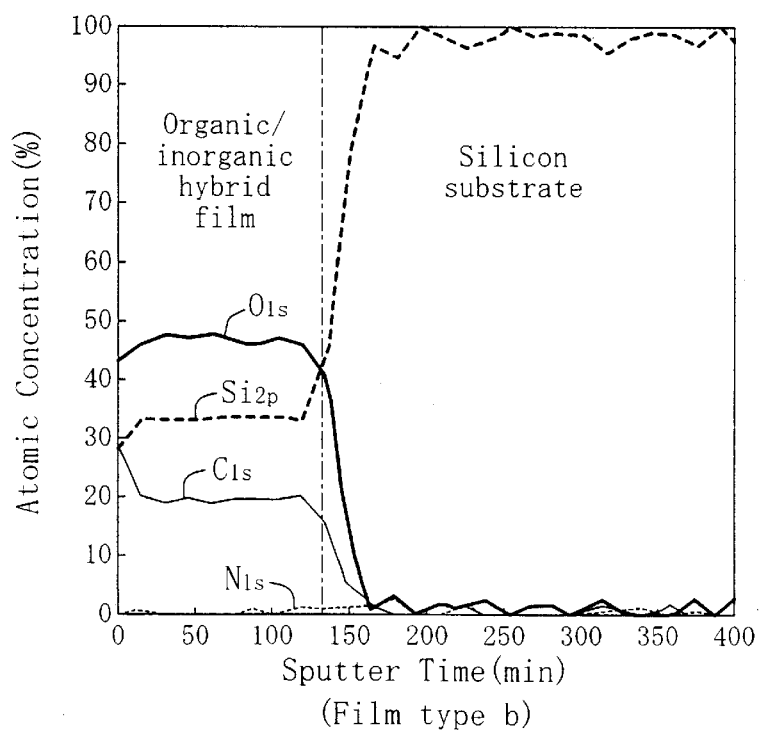
FIG. 5(b) (Film type b)

(Film type c)

(Film type d)

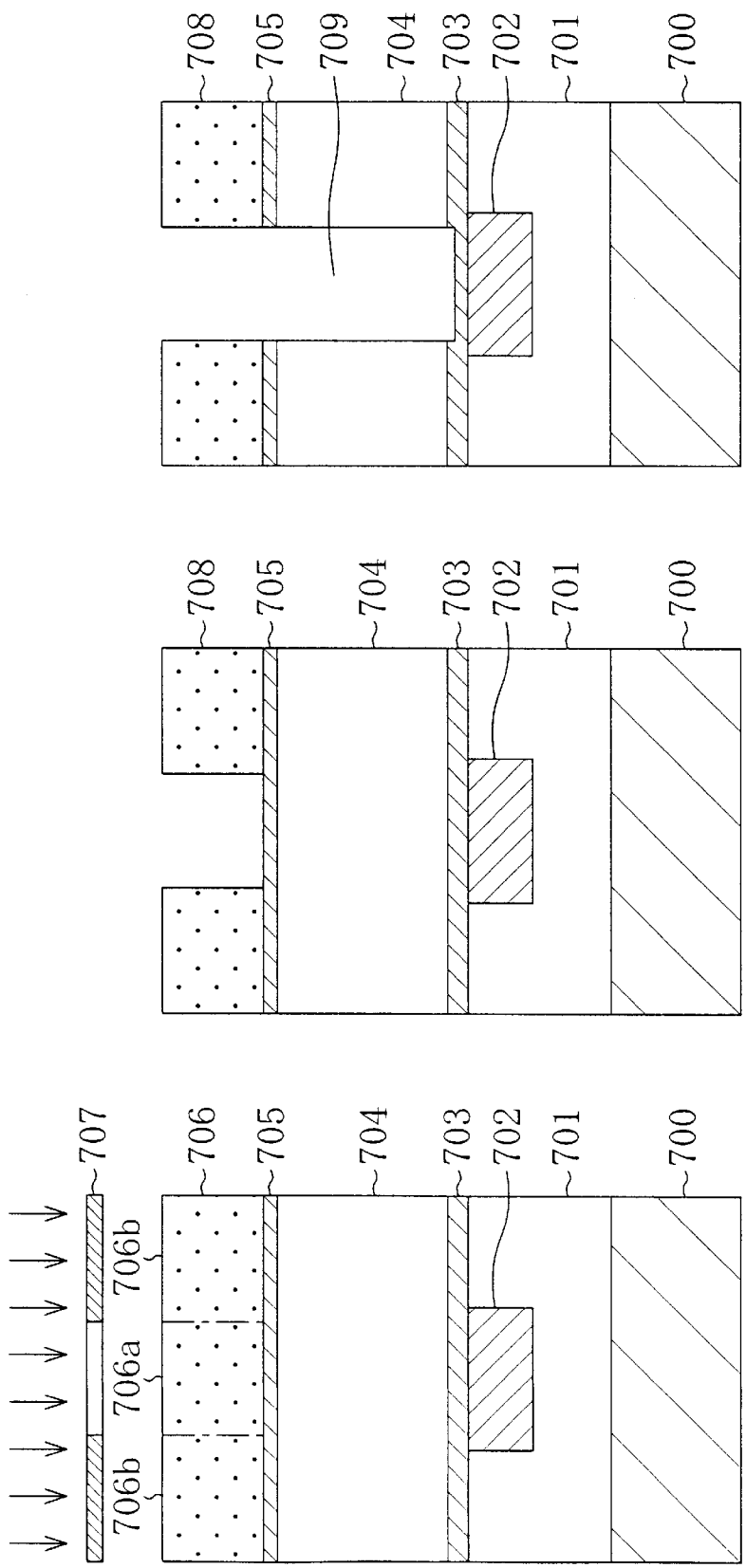

US 6,632,746 B2

ETCHING METHOD, SEMICONDUCTOR AND FABRICATING METHOD FOR THE SAME

BACKGROUND OF THE INVENTION

The present invention relates to a method for etching an organic/inorganic hybrid film represented by $SiC_xH_yO_z$ (x>0, y≧0, z>0), a semiconductor device having an interlayer insulating film made of the organic/inorganic hybrid film, and a fabricating method for such a semiconductor device.

Recent semiconductor integrated circuit devices adopt multilayer interconnection structures to meet requests for size scale-down and higher integration. Conventionally, a silicon oxide ($SiO_2$) film has been used as an interlayer insulating film provided between lower interconnections and upper interconnections. Contact holes are formed through such an interlayer insulating film by plasma etching for connection with lower interconnections when a multilayer interconnection structure is adopted.

Hereinafter, as a first conventional example, an etching method for formation of contact holes through an interlayer insulating film made of a silicon oxide film will be described with reference to FIGS. 22(a) to 22(d).

First, as shown in FIG. 22(a), a lower interconnection 12 made of copper, for example, is formed in an insulating film 11 deposited on a semiconductor substrate 10 by a known method. On the lower interconnection 12, deposited is an etching stopper film 13 made of a silicon nitride ($Si_3N_4$) film, for example, that has the function of preventing the lower interconnection 12 from oxidizing during etching and also stopping the etching. An interlayer insulating film 14 made of a silicon oxide ($SiO_2$) film is deposited on the etching stopper film 13. A resist pattern 15 having an opening for formation of a contact hole is then formed on the interlayer insulating film 14. Note that, although illustration is omitted, the sides and the bottom of the lower interconnection 12 are normally coated with barrier metal.

Thereafter, as shown in FIG. 22(b), a contact hole 16 is formed through the interlayer insulating film 14 using the resist pattern 15 as a mask by plasma etching with an etching gas containing fluorine and carbon, such as $CF_4$ gas, $C_2F_6$ gas, $C_3F_8$ gas, $CHF_3$ gas, $C_3F_8$ gas, or $C_4F_8$ gas.

As shown in FIG. 22(c), the resist pattern 15 is removed by ashing with oxygen plasma. As shown in FIG. 22(d), the portion of the etching stopper layer 13 exposed in the contact hole 16 is removed.

In recent years, further scale-down and higher integration of multilayer interconnection structures have been demanded, and with realization of this demand, signal delay at interconnections has become greatly influential to the operation speed of a semiconductor integrated circuit.

In order to reduce signal delay at interconnections, it has been proposed to use a film having a low dielectric constant (∈=2 to 3) as the interlayer insulating film. As such a film having a low dielectric constant, known are an organic insulating film containing an organic compound as a main component, a fluorine-containing insulating film made of a fluorine-containing silicon oxide (SiOF), and an organic/inorganic hybrid film represented by $SiC_xH_yO_z$ (x>0, y≧0, z>0). Japanese Laid-Open Patent Publication No. 10-125674 proposes an organic/inorganic hybrid film made of a silicon oxide film containing carbon and hydrogen, deposited by feeding hexamethyldisiloxane (HMDSO) as a material gas.

The organic insulating film, of which the composition is similar to that of a resist film, has the following problem. When a resist pattern formed on the organic insulating film is to be removed by ashing with oxygen plasma, the organic insulating film itself is damaged by the oxygen plasma. The fluorine-containing insulating film has the problem that it easily comes off due to its poor adhesion to an underlying film and also it is poor in mechanical strength and heat resistance.

The organic/inorganic hybrid film has a specific dielectric constant considerably smaller than the fluorine-containing insulating film and has a mechanical strength roughly equal to that of the fluorine-containing insulating film. Moreover, the organic/inorganic hybrid film, of which the composition is not similar to that of a resist film, is less damaged by oxygen plasma, and therefore, the resist pattern can be removed by ashing with oxygen plasma.

In consideration of the above, the organic/inorganic hybrid film is promising as an interlayer insulating film having a low specific dielectric constant.

With the recent demand for size scale-down and higher integration of semiconductor integrated circuit devices, also, the diameter of contact holes formed through the interlayer insulating film has become finer and the aspect ratio of the contact holes has become larger. It is difficult to fill such fine contact holes having a large aspect ratio with a conductive material with reliability.

To solve the above problem, Japanese Laid-Open Patent Publication No. 8-191062, for example, proposes a technique in which the diameter of the contact holes is made larger near the opening thereof than near the bottom thereof, to facilitate filling of the contact holes with a conductive material.

Hereinafter, as the second conventional example, the etching method disclosed in Japanese Laid-Open Patent Publication No. 8-191062 will be described with reference to FIGS. 23(a) to 23(d). Note that in FIGS. 23(a) to 23(d), illustration of a lower interconnection is omitted.

First, as shown in FIG. 23(a), a resist pattern 15 having an opening 15a for formation of a contact hole is formed on an interlayer insulating film 14 made of a silicon oxide film deposited on a semiconductor substrate 10.

As shown in FIG. 23(b), the interlayer insulating film 14 is subjected to anisotropic dry etching with an etching gas containing fluorine and carbon using the resist pattern 15 as a mask, to form a contact hole 16 to reach partway in the interlayer insulating film 14.

Isotropic dry etching is then performed for the interlayer insulating film 14 with an etching gas including oxygen gas. By this etching, as shown in FIG. 23(c), an opening 15a of the resist pattern 15 is widened, and with this, the diameter of the contact hole 16 is made larger near the opening thereof, to provide a tapered wall at the opening of the contact hole 16.

As shown in FIG. 23(d), the resist pattern 15 is removed. Although illustration is omitted, by depositing a conductive material on the interlayer insulating film 14, the contact hole 16 is filled with the conductive material with reliability.

(First Problem)

The plasma etching for forming fine contact holes through an organic/inorganic hybrid film is normally performed with an etching gas containing fluorine and carbon, which can cleave Si—O bonds, as in the plasma etching of a silicon oxide film.

However, when the organic/inorganic hybrid film is etched with the same etching gas under the same conditions as those used for etching of the silicon oxide film, the etching rate largely decreases, or in an extreme case, the etching itself stops. The decrease in etching rate causes reduction in throughput. This also causes reduction in the difference between the etching rate of the interlayer insulating film and that of the resist pattern, failing to secure a sufficiently large etching selection ratio.

By adding oxygen gas to the etching gas, the etching rate of the organic/inorganic hybrid film increases. However, this also facilitates etching of the resist pattern 15, and thus the etching selection ratio of the interlayer insulating film 14 to the resist pattern 15 decreases.

The addition of oxygen gas to the etching gas also increases the etching rate of the silicon nitride film constituting the etching stopper film 13. This reduces the etching selection ratio of the interlayer insulating film 14 to the etching stopper film 13.

Therefore, it is not preferable to add oxygen gas to the etching gas.

In view of the above, the first object of the present invention is providing good plasma etching for an organic/inorganic hybrid film.

(Second Problem)

As described above, the etching stopper film 13 made of a silicon nitride film is deposited on the lower interconnection 12 made of a copper film, for example. The specific dielectric constant of the silicon nitride film is about 7, which is significantly large compared with the specific dielectric constant of the organic/inorganic hybrid film.

Having such an etching stopper film, therefore, the reduction in specific dielectric constant between the upper and lower interconnections is not sufficiently attained despite of the formation of the interlayer insulating film 14 made of the organic/inorganic hybrid film in an attempt to reduce the specific dielectric constant.

In view of the above, the second object of the present invention is reducing the specific dielectric constant between the upper and lower interconnections by reducing the specific dielectric constant of the etching stopper film.

(Third Problem)

The second conventional example described above is an etching technique in which the resist film is etched more isotropically to widen the openings of the resist film by adding oxygen gas to the etching gas, to thereby provide contact holes having a tapered opening. However, this technique requires a large amount of etching of the resist film, and therefore it is not possible to increase the thickness of the resist film in an attempt to form contact holes having a large aspect ratio. For this reason, the second conventional example finds difficulty in application to formation of contact holes having a large aspect ratio. In particular, in the case of forming tapered contact holes through the interlayer insulating film made of an organic/inorganic hybrid film, how the etching amount of the resist film should be reduced is a big problem to be solved.

There is also reported a technique in which the contact holes are etched into a tapered shape using an etching gas containing fluorine and carbon without changing the diameter of the openings of the resist film. However, whether or not this technique is applicable to the formation of contact holes through the interlayer insulating film made of an organic/inorganic hybrid film has not been verified.

In view of the above, the third object of the present invention is providing a method in which contact holes having an increased diameter near the opening thereof can be formed through an interlayer insulating film made of an organic/inorganic hybrid film with reliability.

(Fourth Problem)

In recent years, in order to enhance the resolution between light exposed portions and non-exposed portions of a resist film, there has been proposed a technique of forming a resist pattern using a chemical amplification resist material. According to this technique, the polarity (solubility to a developer) is changed in portions of the resist film made of a chemical amplification resist material exposed to an energy beam by the function of acid generated in the exposed portions. The exposed portions or non-exposed portions are then removed with the developer, to form a resist pattern.

The present inventors formed a resist film by applying a chemical amplification resist material to an organic/inorganic hybrid film, and subjected the resist film to pattern light exposure. As a result, it was found that exposed portions of the resist film failed to sufficiently change the polarity presumably due to a reduced amount of acid generated in the exposed portions. Therefore, the resultant resist pattern after removal of the exposed portions or non-exposed portions of the resist film with a developer was faulty in shape.

The present inventors attempted to increase the exposure amount during the pattern light exposure, but failed to sufficiently change the polarity of the exposed portions of the resist film.

The faulty formation of the resist pattern did not occur when a chemical amplification resist film was formed on a silicon oxide film, but was unique to the chemical amplification resist film formed on an organic/inorganic hybrid film. The faulty formation of the resist pattern was confirmed to occur when using a positive chemical amplification resist film, but is presumed to also occur when using a negative chemical amplification resist film.

Hereinafter, a problem occurring in the formation of multilayer interconnections having a dual damascene structure, which uses a chemical amplification resist pattern formed on an organic/inorganic hybrid film, will be described with reference to FIGS. 24(a), 24(b), and 25.

First, as shown in FIG. 24(a), a lower interconnection 22 is formed on an insulating film 21 deposited on a semiconductor substrate 20. An etching stopper film 23 is deposited on the lower interconnection 22, and then an interlayer insulating film 24 made of an organic/inorganic hybrid film is deposited on the etching stopper film 23. Thereafter, a contact hole 25 is formed through the interlayer insulating film 24 by plasma etching using a first resist pattern that is formed on the interlayer insulating film 24 and has an opening for formation of the contact hole.

A chemical amplification resist material is then applied to the resultant interlayer insulating film 24 to form a resist film. The resist film is then subjected to pattern light exposure and development, to form a second resist pattern 26 having an opening for formation of an interconnection groove. At this stage, the resist film partly remains after the above processing, forming a resist film 26a over the top surface of the interlayer insulating film 24 as well as the wall and the bottom of the contact hole 25. The reason why the resist film 26a is formed is considered that acid has been reacted with some reactive group and consumed.

Thereafter, the interlayer insulating film 24 is subjected to plasma etching using the second resist pattern 26 as a mask, to form an interconnection groove 27 in the interlayer insulating film 24 as shown in FIG. 24(b). During this etching, a barrier (inner crown) 28 made of the interlayer insulating film 24 is formed since the resist film 26a on the inner side of the interconnection groove 27 serves as a mask.

After removal of the second resist pattern 26 and the resist film 26a as shown in FIG. 25, the contact hole 25 and the interconnection groove 27 are filled with a conductive material to form a plug and an upper interconnection. At this time, due to the existence of the barrier 28 on the inner side of the interconnection groove 27, the contact resistance between the upper interconnection embedded in the interconnection groove 27 and the plug embedded in the contact hole 25 disadvantageously increases.

In view of the above, the fourth object of the present invention is preventing deactivation of acid in a chemical amplification resist film formed on an organic/inorganic hybrid film, to improve the resolution of the resist film.

SUMMARY OF THE INVENTION (First Resolution Principle)

In order to solve the first problem, the present inventors examined the reason for the reduction of the etching rate when an organic/inorganic hybrid film is subjected to plasma etching with an etching gas containing fluorine and carbon, and found the following.

FIG. 26(a) illustrates a cross-sectional structure of a contact hole 16 formed by dry-etching an interlayer insulating film 14A made of a silicon oxide film with an etching gas containing fluorine and carbon. FIG. 26(b) illustrates a cross-sectional structure of a contact hole 16 formed by dry-etching an interlayer insulating film 14B made of an organic/inorganic hybrid film with an etching gas containing fluorine and carbon.

An etching gas normally contains a carbon component for protection of the resist pattern 15. Therefore, in the dry etching of the interlayer insulating film 14A made of a silicon oxide film, a thin polymer film 17A is deposited on a wall 16a and a bottom 16b of the contact hole 16 as shown in FIG. 26(a). In this process, therefore, both the deposition of the polymer film 17A and the etching proceed competing with each other at the wall 16a and the bottom 16b of the contact hole 16. At the bottom 16b, however, the etching predominates over the deposition. Accordingly, the bottom 16b of the contact hole 16 moves downward, that is, toward the etching stopper film 13.

In the case of dry etching of the interlayer insulating film 14B made of an organic/inorganic hybrid film, a carbon component is contained, not only in the etching gas, but also in the organic/inorganic hybrid film. Therefore, as shown in FIG. 26(b), an etching reaction gas containing a carbon component is generated at the wall 16a and the bottom 16b of the contact hole 16 during the etching of the organic/inorganic hybrid film. As a result, a polymer film 17B having a larger thickness than that shown in FIG. 26(a) is deposited. In this case, also, both the deposition of the polymer film 17B and the etching proceed competing with each other at the bottom 16b of the contact hole 16. However, in this case, progress of the etching is blocked by the carbon component at the bottom 16b of the organic/inorganic hybrid film, together with the polymer film 17B. In the early stage of the etching, that is, when the depth of the contact hole 16 is small, when the introduced amount of the plasma etching species and the plasma energy are sufficient, the etching predominates over the deposition of the polymer film 17B, and therefore the etching proceeds. As the contact hole 16 becomes deeper with the progress of the etching, however, the introduced amount of the plasma etching species and the plasma energy become insufficient, failing to sufficiently remove the carbon component in the organic/inorganic hybrid film. Therefore, a surplus of the carbon component is accumulated on the bottom 16b of the contact hole 16, blocking smooth etching reaction. Since the deposition of the polymer film 17B predominates over the etching, the etching rate gradually decreases, and finally the etching stops.

In consideration of the above, if the etching is carried out while sufficiently removing the polymer film on the bottom of the contact hole and the carbon component existing in the portion of the organic/inorganic hybrid film exposed in the contact hole, the etching should proceed smoothly.

The first and second etching methods according to the present invention are based on the first resolution principle described above.

The first etching method of the present invention is directed to a method for plasma-etching an organic/inorganic hybrid film represented by $SiC_xH_yO_z$ (x>0, y≧0, z>0), including the step of: plasma-etching the organic/inorganic hybrid film while eliminating a carbon component from a surface portion of the organic/inorganic hybrid film.

According to the first etching method, the plasma etching is performed while the surface portion of the organic/inorganic hybrid film is reformed by elimination of a carbon component from the surface portion of the organic/inorganic hybrid film. Therefore, in the carbon-eliminated surface portion, in which the amount of the carbon component that facilitates deposition of a polymer film is small, the etching rate improves.

The second etching method of the present invention is directed to a method for plasma-etching an organic/inorganic hybrid film represented by $SiC_xH_yO_z$ (x>0, y≧0, z>0), including repeating alternately a first step of eliminating a carbon component from a surface portion of the organic/inorganic hybrid film and a second step of plasma-etching the surface portion from which the carbon component has been eliminated.

According to the second etching method, the first step of eliminating a carbon component from the surface portion of the organic/inorganic hybrid film and the second step of plasma-etching the surface portion from which the carbon component has been eliminated are performed alternately. Therefore, in the carbon-eliminated surface portion, in which the amount of the carbon component that facilitates deposition of a polymer film is small, the etching rate improves.

In the first or second etching method, plasma etching is performed in the state where the carbon component has been eliminated from the surface portion of the organic/inorganic hybrid film, that is, in the state where the amount of the carbon component that blocks cleaving of Si—O bonds and generation of $CO_2$, $SiF_4$, and the like is small in the surface portion of the organic/inorganic hybrid film. Therefore, the etching rate improves. This improves the throughput and also increases the etching selection ratio with respect to the resist pattern.

The second etching method is especially effective in the case that the preferred conditions under which the carbon component is eliminated from the surface portion are different from the preferred conditions under which the surface portion is plasma-etched, such as the case that the preferred gas pressure adopted when the carbon component is eliminated from the surface portion is largely different from the preferred gas pressure adopted when the organic/inorganic hybrid film is plasma-etched.

In the first etching method, the plasma etching is preferably performed with an etching gas containing fluorine, carbon and nitrogen.

In the second etching method, preferably, the first step is performed with a gas containing nitrogen, and the second step is performed with an etching gas containing fluorine and carbon.

In the above case, the gas containing nitrogen may be a mixed gas of hydrogen and nitrogen or ammonia gas.

When a gas containing nitrogen comes into contact with the surface of an organic/inorganic hybrid film represented by $SiC_xH_yO_z$ (x>0, y≧0, z>0), "$C_xH_y$" is chemically changed to highly volatile HCN or CN at the surface of the $SiC_xH_yO_z$ film, and thus the proportion of the carbon component decreases in the surface portion of the organic/inorganic hybrid film ($SiC_xH_yO_z$ film). Therefore, the etching of the organic/inorganic hybrid film proceeds at roughly the same etching rate as that for a silicon oxide film. This mechanism will be described according to reaction formulae as follows.

When a gas containing nitrogen comes into contact with the surface of the organic/inorganic hybrid film represented by $SiC_xH_yO_z$, chemical reaction represented by Formula 1 or Formula 2 below proceeds.

Formula 1

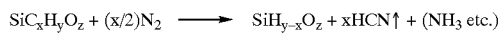

$SiC_xH_yO_z + (x/2)N_2 \longrightarrow SiH_{y-x}O_z + xHCN\uparrow + (NH_3 \text{ etc.})$ Formula 2

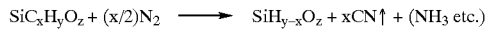

$SiC_xH_yO_z + (x/2)N_2 \longrightarrow SiH_{y-x}O_z + xCN\uparrow + (NH_3 \text{ etc.})$ That is, in the surface portion of the organic/inorganic hybrid film, the carbon component is eliminated, to provide a reformed film having a composition similar to that of a silicon oxide film.

Thereafter, when an etching gas containing fluorine and carbon comes into contact with the reformed layer of the organic/inorganic hybrid film, the $CF_x$ contained in the etching gas reacts with the reformed layer as represented by Formula 3 or Formula 4 below, and thus etching proceeds.

Formula 3

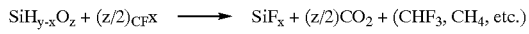

$SiH_{y-x}O_z + (z/2)C_Fx \longrightarrow SiF_x + (z/2)CO_2 + (CHF_3, CH_4, \text{ etc.})$

+

Formula 4

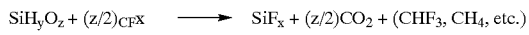

$SiH_yO_z + (z/2)C_Fx \longrightarrow SiF_x + (z/2)CO_2 + (CHF_3, CH_4, \text{ etc.})$ Thus, "$C_xH_y$" is removed from the surface portion of the $SiC_xH_yO_z$ film, to form the reformed layer represented by $SiH_{y-x}O_z$ or $SiH_yO_z$, and the reformed layer is then etched with an etching gas containing fluorine and carbon. In this way, the plasma etching can be performed for the organic/inorganic hybrid film ($SiC_xH_yO_z$ film) at roughly the same etching rate as that for a silicon oxide film ($SiO_2$ film).

The above phenomenon that C or $C_xH_y$ is removed from the $SiC_xH_yO_z$ film implies that the proportion of oxygen atoms in the film increases. This phenomenon can therefore be considered as oxidation.

The reformation of the surface portion of the $SiC_xH_yO_z$ film is a process of removing the carbon component in the surface portion of the $SiC_xH_yO_z$ film by changing the carbon component to HCN or CN. Therefore, if no hydrogen atoms or only a small amount of hydrogen atoms are contained in the $SiC_xH_yO_z$ film, hydrogen gas may be mixed in the gas for reformation to enable efficient progress of the reformation and thus the etching.

In plasma etching of an inorganic insulating film containing no carbon component at all, such as a SiOF film, there is known an etching method using an etching gas obtained by mixing a nitride such as $NH_3$ in a $CF_4$ gas that is normally used for etching of a silicon oxide film (Japanese Laid-Open Patent Publication No. 9-263050).

The above conventional etching method is based on a technical thought as follows. By mixing a nitride in the etching gas, fluorine radicals (F*) in the plasma of the etching gas are scavenged by hydrogen atoms (H), nitrogen atoms (N), or active species thereof freely existing in the plasma, to thereby enhance the selectivity with respect to a silicon substrate or a resist film. This technical thought in Japanese Laid-Open Patent Publication No. 9-263050 is therefore completely different from the etching method of the present invention in which a gas containing a nitrogen component is used for eliminating a carbon component from the surface portion of an organic/inorganic hybrid film represented by $SiC_xH_yO_z$.

(Second Resolution Principle)

The second resolution principle is for solving the second problem described above. This utilizes the mechanism that the etching rate is reduced by the existence of a carbon component contained in an organic/inorganic hybrid film represented by $SiC_xH_yO_z$. That is, an organic/inorganic hybrid film is used as the etching stopper film, in place of a silicon nitride film conventionally used. More specifically, under the interlayer insulating film made of an organic/inorganic hybrid film, an etching stopper film made of an organic/inorganic hybrid film in which the proportion of the carbon component is large compared with the interlayer insulating film is provided.

In place of the organic/inorganic hybrid film, any of silicon insulating films in which the proportion of the carbon component is large, such as a SiC film and the like, may be used.

The first fabricating method for a semiconductor device of the present invention includes the steps of: depositing an etching stopper film on an interconnection layer formed on a substrate, the etching stopper film being represented by $SiC_xH_yO_z$ (x>0, y≧0, z≧0) in which the proportion of carbon atoms with respect to silicon atoms is relatively large; depositing an interlayer insulating film on the etching stopper film, the interlayer insulating film being represented by $SiC_xH_yO_z$ (x>0, y≧0, z>0) in which the proportion of carbon atoms with respect to silicon atoms is relatively small; and forming a contact hole through the interlayer insulating film by plasma-etching the interlayer insulating film.

The first semiconductor device of the present invention includes: an etching stopper film formed on an interconnection layer formed on a substrate, the etching stopper film being represented by $SiC_xH_yO_z$ (x>0, y≧0, z≧0) in which the proportion of carbon atoms with respect to silicon atoms is relatively large; an interlayer insulating film formed on the etching stopper film, the interlayer insulating film being represented by $SiC_xH_yO_z$ (x>0, y≧0, z>0) in which the proportion of carbon atoms with respect to silicon atoms is relatively small; and a contact hole formed through the interlayer insulating film by plasma etching.

According to the first fabricating method of a semiconductor device and the first semiconductor device, the etching stopper film containing a carbon component in a large proportion compared with the interlayer insulating film is formed under the interlayer insulating film. Therefore, once the plasma etching of the interlayer insulating film is completed, the following phenomenon occurs. The etching stopper film containing a larger amount of a carbon component is more or less etched and generates an etching reaction gas containing a carbon component, which is mixed in the plasma. In addition, a large amount of the carbon component exists in the etching stopper film and on the surface thereof. Therefore, a thick polymer film is deposited on the bottom of the contact holes and this sharply reduces the etching rate of the etching stopper film.

Thus, the etching stopper film made of the second organic/inorganic hybrid film in which the proportion of the carbon component is relatively large serves as the etching stopper film for the interlayer insulating film made of the first organic/inorganic hybrid film in which the proportion of the carbon component is relatively small when the latter is plasma-etched to form a contact hole.

In addition, since the above etching stopper film is made of an insulating film having a low specific dielectric constant, the specific dielectric constant between the lower and upper interconnections can be largely reduced, compared with the case of using a silicon nitride film having a large specific dielectric constant.

In the first fabricating method of a semiconductor device, the plasma etching is performed with an etching gas containing fluorine, carbon and nitrogen.

(Third Resolution Principle)

The third resolution principle is for solving the third problem described above. This utilizes the mechanism that the etching rate is reduced by the existence of a carbon component contained in an organic/inorganic hybrid film represented by $SiC_xH_yO_z$. Specifically, the mechanism is that with increase in the amount of the carbon component contained in an organic/inorganic hybrid film, the polymer film deposited on the wall of a contact hole is thicker and this reduces the etching rate, and with decrease in the amount of the carbon component contained in the organic/inorganic hybrid film, the polymer film deposited on the wall of the contact hole is thinner and this increases the etching rate. The third resolution principle can be realized by the following first and second schemes.

In the first scheme, the lower part of the interlayer insulating film is made of a first organic/inorganic hybrid film that contains a carbon component in a relatively small proportion, and the upper part of the interlayer insulating film is made of a second organic/inorganic hybrid film that contains a carbon component in a relatively large proportion. Plasma etching is carried out for the upper and lower parts of the interlayer insulating film under the same conditions.

In the second scheme, a fixed proportion of a carbon component is contained in the interlayer insulating film made of an organic/inorganic hybrid film. In the early stage of plasma etching of the interlayer insulating film (etching of the upper part of the interlayer insulating film), the amount of the carbon component eliminated from the wall and the bottom of the contact hole is kept relatively small, while in the late stage of the plasma etching of the interlayer insulating film (etching of the lower part of the interlayer insulating film), the amount of the carbon component eliminated from the wall and the bottom of the contact hole is made relatively large.

The second fabricating method for a semiconductor device of the present invention, which embodies the first scheme of the third resolution principle, includes the steps of: depositing a first interlayer insulating film on an interconnection layer formed on a substrate, the first interlayer insulating film being represented by $SiC_xH_yO_z$ (x>0, y≧0, z≧0) in which the proportion of carbon atoms with respect to silicon atoms is relatively small; depositing a second interlayer insulating film on the first interlayer insulating film, the second interlayer insulating film being represented by $SiC_xH_yO_z$ (x>0, y≧0, z>0) in which the proportion of carbon atoms with respect to silicon atoms is relatively large; and plasma-etching the second interlayer insulating film and the first interlayer insulating film sequentially, to form a first opening through the second interlayer insulating film, the diameter of the first opening being smaller toward the bottom end, and a second opening through the first interlayer insulating film, the wall of the second opening being vertical to the bottom surface.

The second semiconductor device of the present invention includes: a first interlayer insulating film deposited on a substrate, the first interlayer insulating film being represented by $SiC_xH_yO_z$ (x>0, y≧0, z≧0) in which the proportion of carbon atoms with respect to silicon atoms is relatively small; a second interlayer insulating film deposited on the first interlayer insulating film, the second interlayer insulating film being represented by $SiC_xH_yO_z$ (x>0, y≧0, z>0) in which the proportion of carbon atoms with respect to silicon atoms is relatively large; a first opening formed through the second interlayer insulating film by plasma-etching, the diameter of the first opening being smaller toward the bottom end; and a second opening formed under the first opening through the first interlayer insulating film, the wall of the second opening being vertical to the bottom surface.

According to the second fabricating method for a semiconductor device and the second semiconductor device, the second interlayer insulating film deposited on the first interlayer insulating film contains a larger proportion of the carbon component than the first interlayer insulating film. Therefore, the following phenomenon occurs during the plasma etching of the second interlayer insulating film. Both the deposition of a polymer film and the etching proceeds competing with each other at the bottom of the first opening. In this occasion, however, an etching reaction gas containing a large amount of the carbon component is generated during the etching of the second interlayer insulating film, which facilitates deposition of polymer on the wall and the bottom of the first opening. In addition, the carbon component in the second interlayer insulating film blocks progress of the etching at the bottom, causing reduction in etching rate toward the bottom. Therefore, with the progress of the etching toward the bottom of the first opening, a larger amount of polymer is deposited on the wall of the first opening. As a result, formed is the first opening of which the diameter is smaller toward the bottom.

The first interlayer insulating film contains a smaller proportion of the carbon component than the second interlayer insulating film. Therefore, the following phenomenon occurs during plasma etching of the first interlayer insulating film. Both the deposition of a polymer film and the etching proceeds competing with each other at the bottom of the second opening. In this occasion, only a comparatively small amount of an etching reaction gas is generated from the first interlayer insulating film during the etching thereof, and thus deposition of a polymer film on the wall and the bottom of the second opening is small. This enables a sufficient amount of the carbon component to be eliminated from the first interlayer insulating film at the bottom of the second opening, and thus prevents reduction in etching rate toward the bottom. Therefore, with the progress of the etching toward the bottom of the second opening, only a small amount of polymer is deposited on the wall of the second opening. As a result, formed is the second opening of which the wall is roughly vertical to the bottom face.

In the second fabricating method of a semiconductor device, the plasma etching is preferably performed with an etching gas containing fluorine, carbon and nitrogen.

The third fabricating method for a semiconductor device of the present invention, which embodies the second scheme of the third resolution principle, includes the steps of: depositing an interlayer insulating film represented by $SiC_xH_yO_z$ ($x>0$, $y\geq0$, $z>0$) on a substrate; performing first plasma-etching for the interlayer insulating film while blocking or suppressing a carbon component from being eliminated from a surface portion of the interlayer insulating film, to form a first opening in the interlayer insulating film, the diameter of the first opening being smaller toward the bottom end; and performing second plasma etching for the interlayer insulating film while facilitating elimination of the carbon component from the surface portion of the interlayer insulating film, to form a second opening under the first opening in the interlayer insulating film, the wall of the first opening being vertical to the bottom surface.

According to the third fabricating method for a semiconductor device, in the first plasma etching for the interlayer insulating film, which is performed while blocking or suppressing the carbon component from being eliminated from the surface portion of the interlayer insulating film, the following phenomenon occurs. Both the deposition of a polymer film and the etching proceeds competing with each other at the bottom of the first opening. In this occasion, however, since elimination of the carbon component from the interlayer insulating film is blocked or reduced, progress of the etching is impeded, and thus the etching rate decreases toward the bottom. Therefore, with the progress of the etching toward the bottom, a larger amount of polymer is deposited on the wall. As a result, the first opening of which the diameter is smaller toward the bottom is formed in the upper part of the interlayer insulating film.

In the second plasma etching for the interlayer insulating film, which is performed while facilitating elimination of the carbon component from the surface portion of the interlayer insulating film, the following phenomenon occurs. Both the deposition of a polymer film and the etching proceeds competing with each other at the bottom of the second opening. In this occasion, since the carbon component is sufficiently eliminated from the surface of the interlayer insulating film, the etching rate does not decrease with progress of the etching toward the bottom. Therefore, only a small amount of polymer is deposited on the wall in comparison with the progress of the etching toward the bottom. As a result, the second opening of which the wall is vertical to the bottom face is formed in the lower part of the interlayer insulating film.

In the third fabricating method for a semiconductor device, preferably, the first plasma etching is performed with a first etching gas containing fluorine, carbon and nitrogen in which the proportion of nitrogen is relatively small, and the second plasma etching is performed with a second etching gas containing fluorine, carbon and nitrogen in which the proportion of nitrogen is relatively large.

(Fourth Resolution Principle)

As described above, the phenomenon that acid generated in the exposed portions of the resist film is deactivated is unique to the chemical amplification resist film formed on an organic/inorganic hybrid film, and does not occur in the chemical amplification resist film formed on a silicon oxide film. It is not possible to prevent this acid deactivation by increasing the exposure of an energy beam emitted to the resist film. From these facts and others, the acid deactivation is presumed to occur as a result of reaction of acid ($H^+$) generated in the exposed portions with a reactive group contained in the organic/inorganic hybrid film.

In the fourth resolution principle, therefore, a silicon oxide film is interposed between the organic/inorganic hybrid film and the chemical amplification resist film for blocking the reaction of acid generated in the exposed portions with a reactive group contained in the organic/inorganic hybrid film.

The fourth fabricating method for a semiconductor device of the present invention includes the steps of: depositing an interlayer insulating film represented by $SiC_xH_yO_z$ ($x>0$, $y\geq0$, $z>0$) on a substrate; forming a silicon oxide film containing no carbon component on the top surface or a surface portion of the interlayer insulating film; forming a resist film made of a chemical amplification resist material on the silicon oxide film; and subjecting the resist film to pattern exposure and development to form a resist pattern made of the resist film.

According to the fourth fabricating method for a semiconductor device, the silicon oxide film containing no reaction group exists between the interlayer insulating film and the resist film made of the chemical amplification resist material. Therefore, acid generated in exposed portions of the resist film is prevented from reacting with the carbon component contained in the interlayer insulating film, and thus prevented from deactivation. This ensures the polarity (solubility to a developer) of the exposed portions of the resist film, and thus after removal of the exposed portions or non-exposed portions of the resist film with a developer, the resultant resist pattern is good in shape.

In the fourth fabricating method for a semiconductor device, the silicon oxide film may be formed by eliminating a carbon component from the surface portion of the interlayer insulating film.

The fifth fabricating method for a semiconductor device of the present invention includes the steps of: depositing an etching stopper film on an interconnection layer formed on a substrate, and then depositing an interlayer insulating film represented by $SiC_xH_yO_z$ ($x>0$, $y\geq0$, $z>0$) on the etching stopper film; forming a contact hole through the interlayer insulating film; forming a resist pattern made of a chemical amplification resist material, the resist pattern having an opening for formation of an interconnection groove, and also forming a protection film made of the chemical amplification resist material on the bottom of the contact hole for protecting the etching stopper film; and plasma-etching the interlayer insulating film using the resist pattern, to form the interconnection groove in the interlayer insulating film.

According to the fifth fabricating method for a semiconductor device, the protection film made of a chemical amplification resist material is formed on the bottom of the contact hole for protecting the etching stopper film. With the protection film formed in the contact hole, the interlayer insulating film is plasma-etched to form an interconnection groove therein. Therefore, the portion of the etching stopper film exposed in the contact hole is prevented from being exposed to the plasma for formation of the interconnection groove and thus is damaged less easily. Using this method, the etching stopper film can be made thin and still can protect the interconnection layer from being still can protect the interconnection layer from being exposed to the plasma. It is therefore possible to avoid damaging of the surface of the interconnection layer or formation of a naturally oxidized film on the surface of the interconnection layer.

The sixth fabricating method for a semiconductor device of the present invention, which corresponds to application of the first and second resolution principles to a fabrication process of a semiconductor device, includes the steps of: depositing an etching stopper film on an interconnection layer formed on a substrate, the etching stopper film being represented by $SiC_xH_yO_z$ (x>0, y≧0, z≧0) in which the proportion of carbon atoms with respect to silicon atoms is relatively large; depositing an interlayer insulating film on the etching stopper film, the interlayer insulating film being represented by $SiC_xH_yO_z$ (x>0, y≧0, z>0) in which the proportion of carbon atoms with respect to silicon atoms is relatively small; depositing a CMP stopper film on the interlayer insulating film; forming a resist pattern having an opening for formation of a contact hole on the CMP stopper film; transferring the opening of the resist pattern to the CMP stopper film, and then plasma-etching the interlayer insulating film while eliminating a carbon component from a surface portion of the interlayer insulating film, to form a contact hole through the interlayer insulating film; after removal of the resist pattern, depositing a conductive film resist pattern, depositing a conductive film on the CMP stopper film to fill the contact hole with the conductive film; and removing a portion of the conductive film exposed on the CMP stopper film by CMP, to form a plug made of the conductive film.

According to the sixth fabricating method for a semiconductor device, a contact hole is formed through the interlayer insulating film by performing plasma etching while eliminating the carbon component from the surface portion of the interlayer insulating film. Formation of a polymer film is reduced on the surface portion from which the carbon component has been eliminated. Therefore, the etching rate does not decrease, and thus the contact hole can be formed through the interlayer insulating film with reliability.

The etching stopper film containing a carbon component in a large proportion compared with the interlayer insulating film is formed under the interlayer insulating film. Therefore, once the plasma etching of the interlayer insulating film is completed, the following phenomenon occurs. The etching stopper film containing a larger amount of a carbon component is more or less etched and generates an etching reaction gas containing a carbon component, which is mixed in the plasma. In addition, a large amount of the carbon component exists in the etching stopper film and on the surface thereof. Therefore, a thick polymer film is deposited on the bottom of the contact hole, and this sharply reduces the etching rate of the etching stopper film. Thus, the etching stopper film in which the proportion of the carbon component is relatively large serves as the etching stopper film when the interlayer insulating film is plasma-etched to form a contact hole.

In addition, the etching stopper film is made of an insulating film having a low specific dielectric constant, and thus enables large reduction in the specific dielectric constant between the lower and upper interconnections, compared with a silicon nitride film having a large specific dielectric constant.

Moreover, the CMP stopper film is interposed between the interlayer insulating film and the conductive film for formation of the plug. The interlayer insulating film is therefore protected from being subjected to CMP when the portion of the conductive film exposed on the CMP stopper film is removed by CMP. Therefore, the interlayer insulating film is prevented from being damaged even though it is made of an organic/inorganic hybrid film that is susceptible to CMP.

The seventh fabricating method for a semiconductor device of the present invention, which corresponds to application of the first and second resolution principles to a fabrication process of multilayer interconnections having a dual structure, includes the steps of: depositing an etching stopper film on a lower interconnection formed on a substrate, the etching stopper film being represented by $SiC_XH_YO_Z$ (x>0, y≧0, z≧0) in which the proportion of carbon atoms with respect to silicon atoms is relatively large; depositing an interlayer insulating film on the etching stopper film, the interlayer insulating film being represented by $SiC_XH_YO_Z$ (x>0, y≧0, z>0) in which the proportion of carbon atoms with respect to silicon atoms is relatively small; depositing a CMP stopper film on the interlayer insulating film; forming a first resist pattern having an opening for formation of a contact hole on the CMP stopper film; transferring the opening of the first resist pattern to the CMP stopper film, and then plasma-etching the interlayer insulating film while eliminating a carbon component from a surface portion of the interlayer insulating film, to form a contact hole through the interlayer insulating film; after removal of the first resist pattern, forming a second resist pattern having an opening for formation of an interconnection groove on the CMP stopper film; transferring the opening of the second resist pattern to the CMP stopper film, and then plasma-etching the interlayer insulating film while eliminating a carbon component from a surface portion of the interlayer insulating film, to form an interconnection groove in the interlayer insulating film; depositing a conductive film on the CMP stopper film to fill the contact hole and the interconnection groove with the conductive film; and removing a portion of the conductive film exposed on the CMP stopper film by CMP, to form a plug and an upper interconnection made of the conductive film.

According to the seventh fabricating method for a semiconductor device, as in the sixth fabricating method, a contact hole is formed through the interlayer insulating film by performing plasma etching while eliminating the carbon component from the surface portion of the interlayer insulating film. Therefore, the etching rate does not decrease, and thus the contact hole and the interconnection groove can be formed in the interlayer insulating film with reliability.

The etching stopper film in which the proportion of the carbon component is relatively large compared with the interlayer insulating film serves as the etching stopper film when the interlayer insulating film is plasma-etched to form a contact hole and an interconnection groove.

In addition, the etching stopper film is made of an insulating film having a low specific dielectric constant, and thus enables large reduction in the specific dielectric constant between the lower and upper interconnection, compared with a silicon nitride film having a large specific dielectric constant.

Moreover, the CMP stopper film is interposed between the interlayer insulating film and the conductive film for formation of the plug and the upper interconnection. The interlayer insulating film is therefore protected from being subjected to CMP when the portion of the conductive film exposed on the CMP stopper film is removed by CMP. Therefore, the interlayer insulating film is prevented from being damaged even though it is made of an organic/inorganic hybrid film that is susceptible to CMP.

Thus, it is ensured to reduce the specific dielectric constant between the lower and upper interconnections in multilayer interconnections having a dual damascene structure.

BRIEF DESCRIPTION OF THE DRAWINGS

FIGS. 5(a) and 5(b) are views showing the relationships between the distance in the depth direction and the atomic concentration obtained from XPS analysis of film types a and b, respectively, of the organic/inorganic hybrid film.

FIGS. 19(a) through 19(c) are cross-sectional views of process steps of a fabricating method for a semiconductor device of the eighth embodiment of the present invention.

DESCRIPTION OF THE PREFERRED EMBODIMENTS (Plasma Processing Apparatus)

Hereinafter, embodiments of the etching methods according to the present invention will be described. First, as a precondition for the embodiments, a plasma processing apparatus used for etching will be described with reference to FIG. 1.

Figure 1:
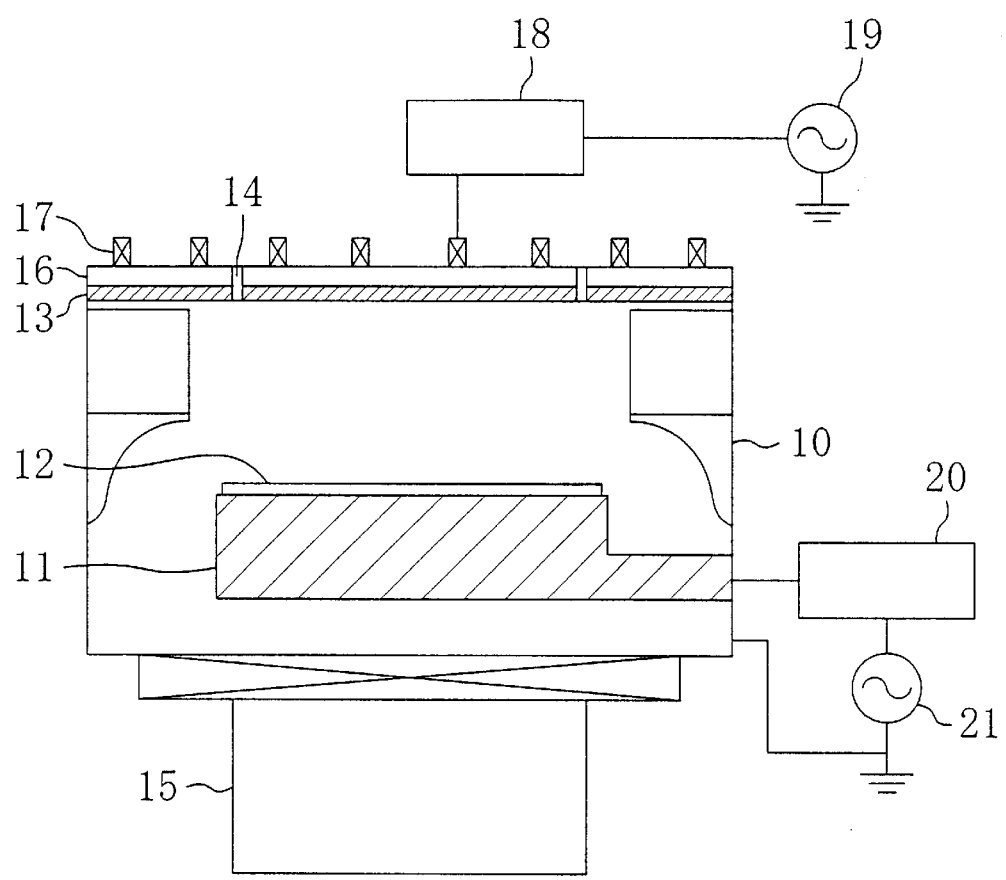
FIG. 1 is a cross-sectional view of the entire construction of a plasma processing apparatus used in embodiments of the present invention.

FIG. 1 shows a cross-sectional structure of the plasma processing apparatus. A lower electrode 11, which is used as a sample mount, is placed in a lower portion of a reaction chamber 10 and holds a semiconductor substrate 12 by electrostatic adsorption. An upper electrode 13 is placed in the upper portion of the reaction chamber 10 to face the lower electrode 11. An etching gas is fed into the reaction chamber 10 via a gas inlet 14 formed at the upper electrode 13. The gas inside the reaction chamber 10 is discharged by a vacuum pump 15 disposed under the reaction chamber 10.

A plasma induction coil 17 is placed on the reaction chamber 10 with an insulator 16 therebetween. An end of the plasma induction coil 17 is connected to a first high-frequency source 19 via a first matching device 18, while the other end is grounded. The lower electrode 11 is connected to a second high-frequency source 21 via a second matching device 20.

When a first high-frequency power is applied to the plasma induction coil 17 from the first high-frequency source 19, a high-frequency induced magnetic field is generated inside the reaction chamber 10, so that the etching gas fed in the reaction chamber 10 becomes plasma. When a second high-frequency power is applied to the lower electrode 11 from the second high-frequency source 21, the plasma generated in the reaction chamber 10 is directed to the lower electrode 11, that is, to the semiconductor substrate 12, which is thus exposed to the plasma.

(First Embodiment)

A plasma etching method of the first embodiment of the present invention carried out using the plasma processing apparatus described above will be described with reference to FIGS. 1, 2, 3, 4, 5(a), 5(b), 6(a), 6(b), and 7.

Figure 3:
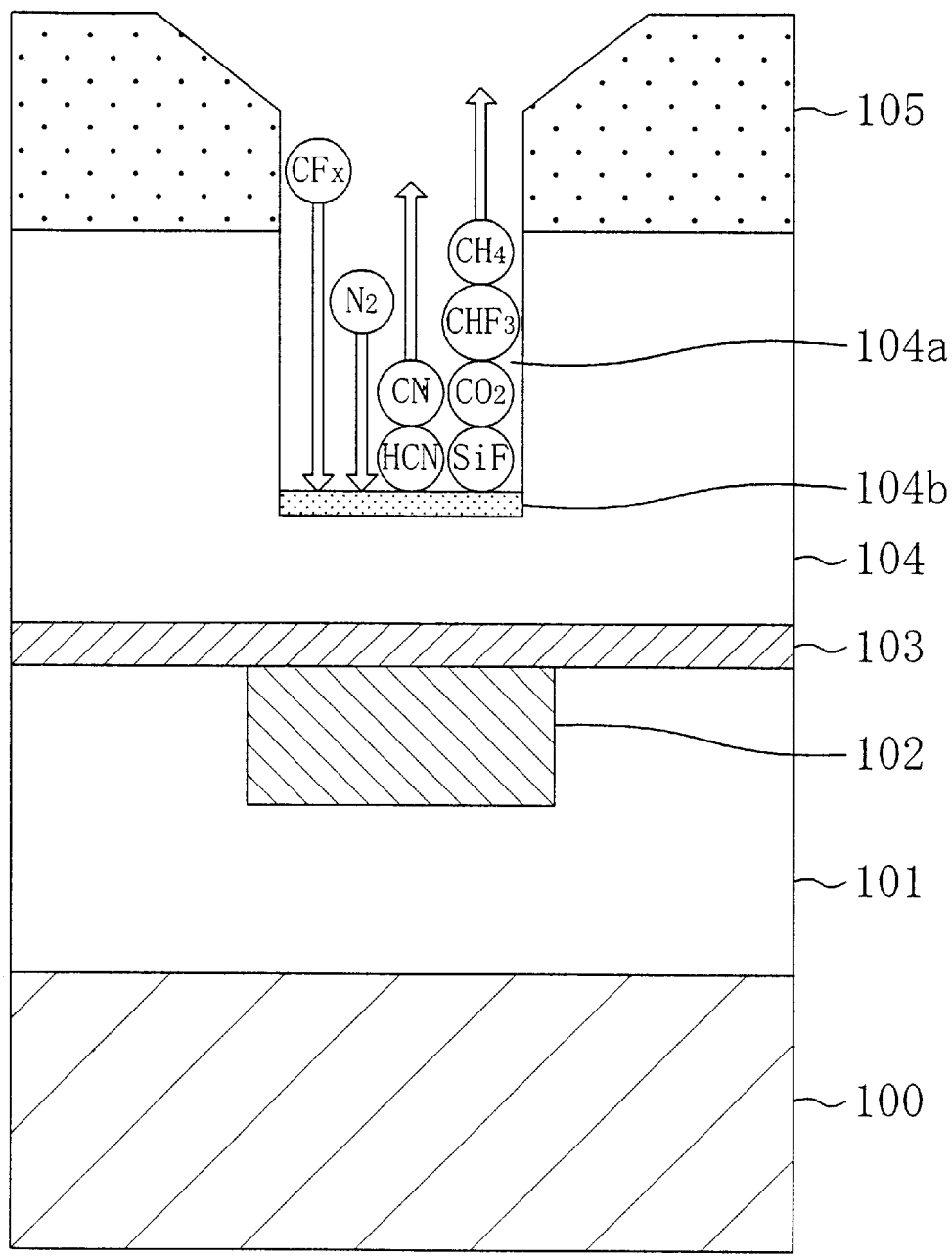
FIG. 3 is a cross-sectional view for description of a mechanism of reforming and then etching a surface portion of an organic/inorganic hybrid film in the etching method of the first embodiment of the present invention.

First, as shown in FIG. 3, an interconnection layer 102 made of an aluminum film, a copper film, an alloy film of aluminum or copper as a main component, or the like is embedded in an insulating film 101 deposited on a semiconductor substrate 100. Note that, although illustration is omitted in FIG. 3, the sides and the bottom of the interconnection layer 102 are coated with barrier metal that prevents metal atoms constituting the interconnection layer 102 from dispersing into the insulating film 101.

Thereafter, an etching stopper film 103 is deposited on the entire top surface of the semiconductor substrate 100 including the interconnection layer 102. The etching stopper film 103, which is made of a silicon nitride film, for example, protects the interconnection layer 102 and also serves as an etching stopper. The etching stopper film 103 is especially required when a dual damascene interconnection structure is formed, and prevents, the interconnection layer 102 from being oxidized with an etching gas during etching of an organic/inorganic hybrid film 104 described below. The etching stopper film 103 also prevents the etching apparatus from being polluted with metal.

The organic/inorganic hybrid film 104 represented by $SiC_xH_yO_z$ (x>0, y≧0, z>0) is then deposited on the etching stopper film 103 using a known CVD apparatus. A resist pattern 105 having openings for formation of contact holes is formed on the organic/inorganic hybrid film 104.

As the gas for deposition of the organic/inorganic hybrid film 104, usable is a mixed gas of a material gas such as tetramethylsilane ($Si(CH_3)_4$), dimethyl.dimethylsiloxane ($Si(CH_3)_2(-O-CH_3)_2$), monomethylsilane ($SiH_3(CH_3)$), or Hexamethyldisiloxane ($Si(CH_3)_3-O-Si(CH_3)_3$) and an additive gas such as $N_2O$. In the first embodiment, a mixed gas of hexamethyldisiloxane (HMDSO) and $N_2O$ was fed into the CVD apparatus, to deposit the organic/inorganic hybrid film 104 made of a hexamethyldisiloxane film on the semiconductor substrate 100 that is kept at 300° C.

Figure 2:
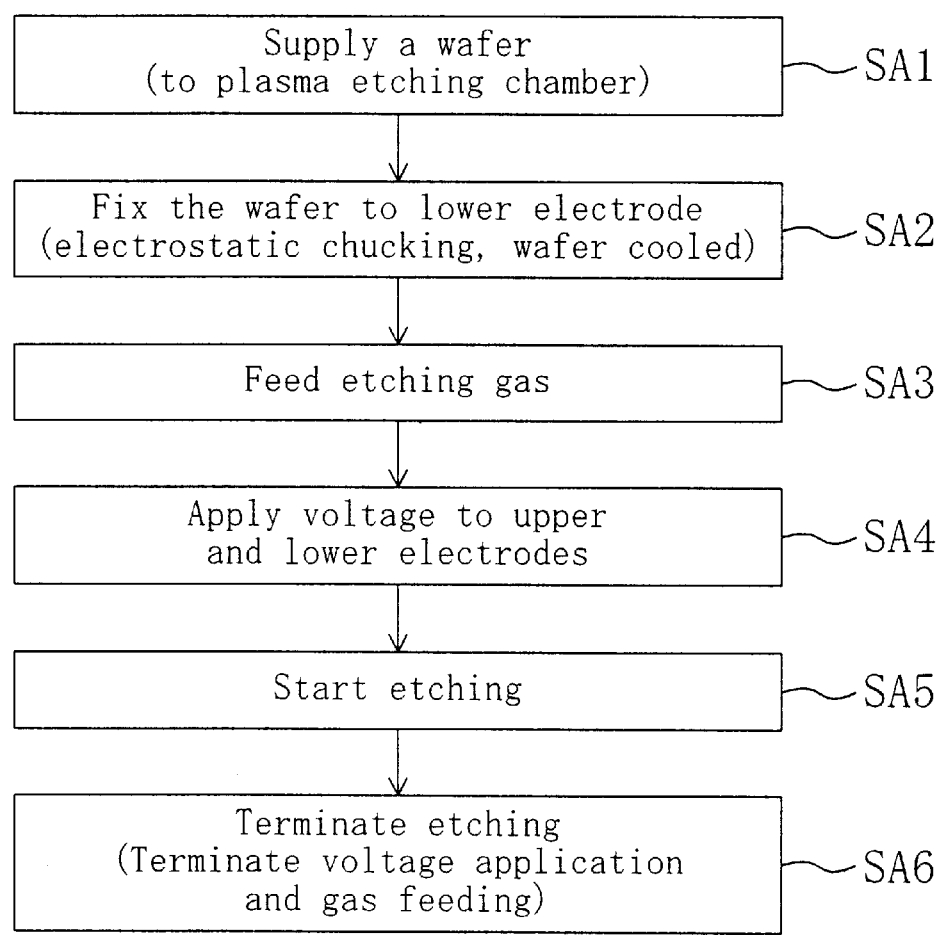
FIG. 2 is a flowchart of an etching method of the first embodiment of the present invention.

Thereafter, in step SA1 shown in FIG. 2, the resultant semiconductor substrate 100 is placed in the reaction chamber 10 of the plasma etching apparatus shown in FIG. 1. In step SA2, the semiconductor substrate 100 is fixed to the lower electrode 11 by electrostatic adsorption.

Figure 4:
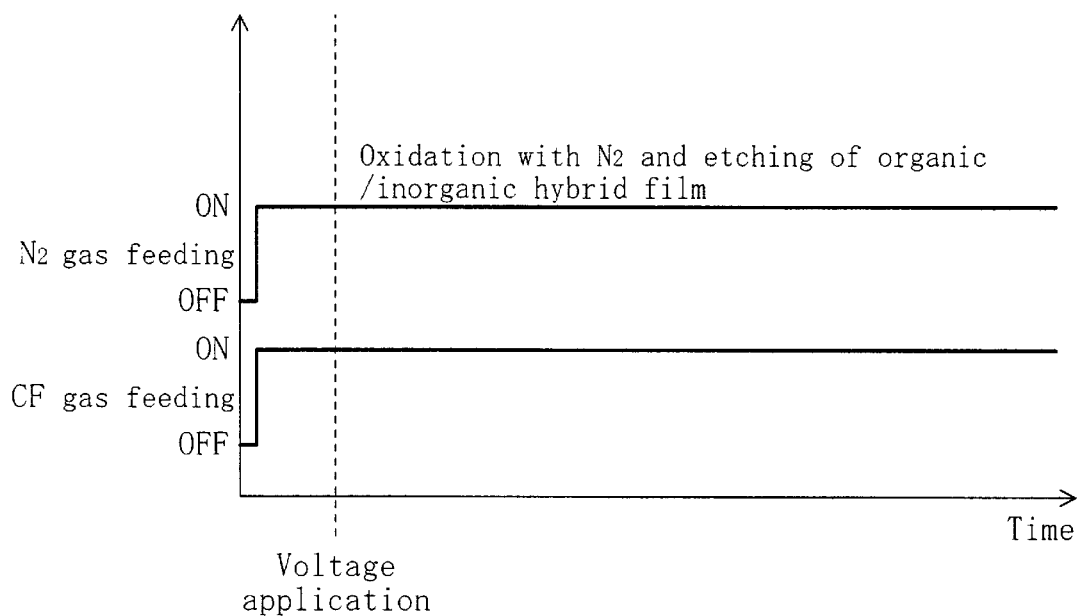
FIG. 4 is a view showing the timing at which a gas containing a $N_2$ component and CF gas are fed in the first embodiment of the present invention.

In step SA3, an etching gas containing fluorine, carbon and nitrogen is fed into the reaction chamber 10 in a manner as shown in FIG. 4. An example of the etching gas containing fluorine, carbon and nitrogen is a mixed gas of a fluorocarbon (CF) gas normally used for etching of a $SiO_2$ film and a $N_2$ gas. Details of the etching gas containing fluorine, carbon and nitrogen will be described later.

In step SA4, the first high-frequency power is applied to the plasma induction coil 17 from the first high-frequency source 19, to generate plasma between the lower electrode 11 and the upper electrode 13. Also, the second high-frequency power is applied to the lower electrode 11 from the second high-frequency source 21. With this application, the etching species in the plasma are attracted to the semiconductor substrate 100. As a result, in step SA5, the organic/inorganic hybrid film 104 is plasma-etched using the resist pattern 105 as a mask.

Once the organic/inorganic hybrid film 104 has been etched to a predetermined depth, in step SA6, the application of the high-frequency voltages to the upper electrode 13 and the lower electrode 11 and the feeding of the etching gas are stopped, to finish the etching.

Hereinafter, an example of the etching gas used for the plasma etching of the organic/inorganic hybrid film 104, as well as the etching conditions thereof, will be described.

First, an etching gas having a volume flow ratio of $C_4F_8:CH_2F_2:Ar:CO:N_2=2:1:10:5:0.5$ is fed via the gas inlet 14 into the reaction chamber 10 that is kept at a pressure of 2.6 Pa. The first high-frequency power of 1500 W at 13.56 MHz, for example, is applied to the plasma induction coil 17 from the first high-frequency source 19, to generate plasma between the lower electrode 11 and the upper electrode 13. Also, the second high-frequency power of 1400 W at 4 MHz, for example, is applied to the lower electrode 11 from the second high-frequency source 21, to attract the etching species in the plasma to the semiconductor substrate 100 to thereby enable plasma etching.

By the plasma etching described above, the etching species such as $N_2$ contained in the plasma are attracted to the bottom of a contact hole 104a, and reacts with carbon atoms and hydrogen atoms existing on the bottom. Thus, on the bottom of the contact hole 104a, a reformed layer (oxidized region) 104b where the carbon component has been eliminated is formed. At this time, a volatile reaction product such as HCN or CN is generated. By this reformation, the composition of the bottom portion (reformed layer 104b) of the contact hole 104a is close to the composition of $SiO_2$. This means that the bottom of the contact hole 104a is nicely etched with the etching species such as $CF_x$ contained in the plasma, while a volatile reaction product such as SiF, $CO_2$, $CHF_3$, or $CH_4$ is generated. As a result, the etching rate at the bottom of the contact hole 104b in the organic/inorganic hybrid film 104 is roughly the same as the etching rate at a silicon oxide ($SiO_2$) film containing no carbon component.

X-ray photoelectron spectroscopy (XPS) analysis was performed for the organic/inorganic hybrid film 104 immediately after the deposition thereof and when plasma processing was performed with $NH_3/N_2$ gas. The results of the analysis are as follows.

FIGS. 5(a), 5(b), 6(a), and 6(b) show the results of XPS analysis of the four types (film types a, b, c, and d) of the organic/inorganic hybrid film 104 that were formed under different deposition conditions. In each graph, the x-axis represents the distance in the depth direction (corresponding to the sputtering time) and the y-axis represents the atomic concentration. FIGS. 4(a), 4(b), 5(a), and 5(b) show the results of film types a, b, c, and d, respectively. The compositions of the four film types a, b, c, and d are as follows: the silicon component occupies about 30%, the oxygen component about 25 to 45%, the carbon component about 17 to 37%, and the nitrogen component about 5% or less. From the XPS analysis results and in consideration of the material gas for film formation, it is presumed that SiC, SiN, and $CH_x$ (x=1 to 3) are captured in the network of $SiO_x$ (x=1 to 3) where the amount of $CH_x$ captured is the largest.

Figure 6A:
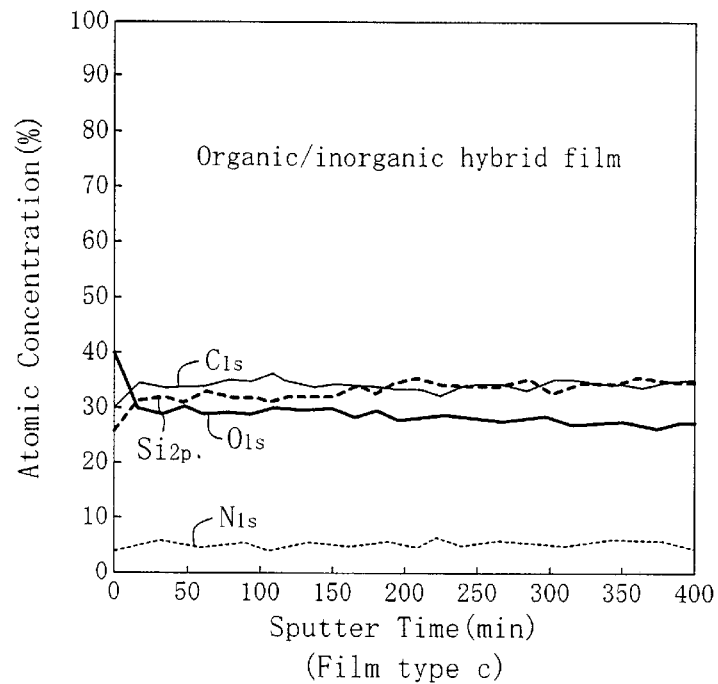
FIGS. 6(a) and 6(b) are views showing the relationships between the distance in the depth direction and the atomic concentration obtained from XPS analysis of film types c and d, respectively, of the organic/inorganic hybrid film.
Figure 6B:
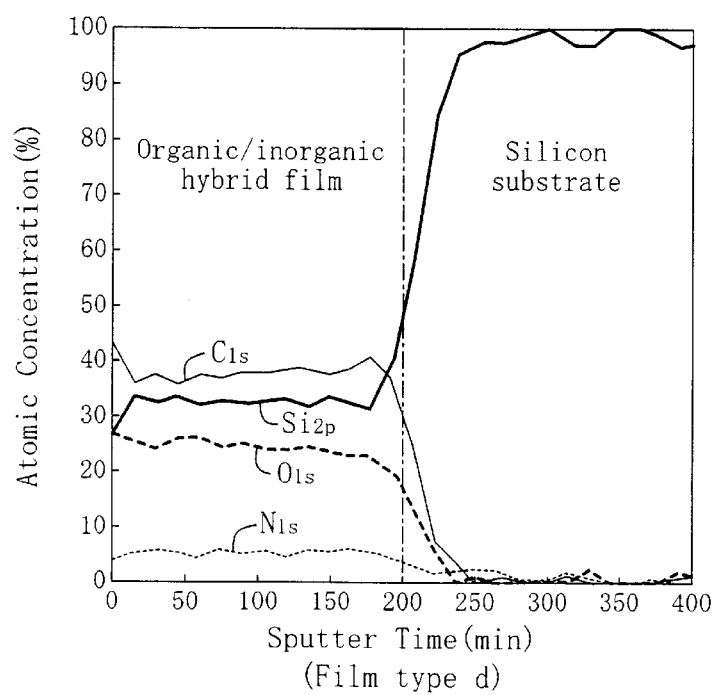
Figure 7:
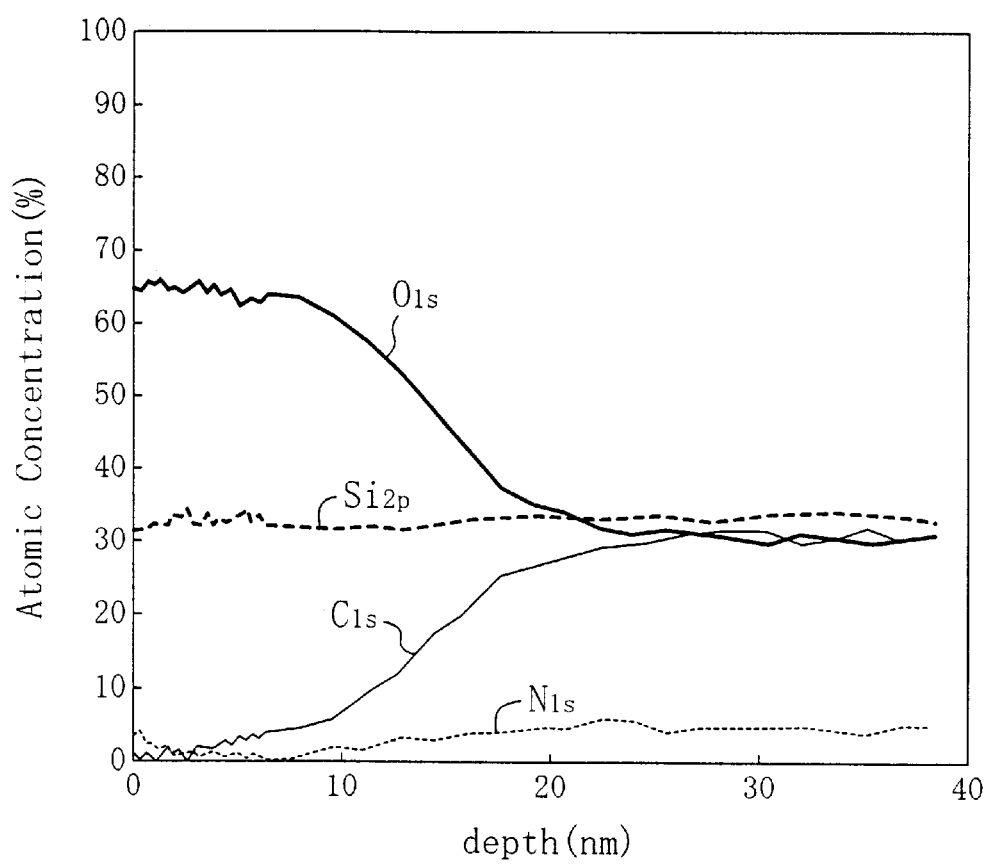
FIG. 7 is a view showing the relationship between the distance in the depth direction and the atomic concentration for a film obtained by reforming the film type c of the organic/inorganic hybrid film using $NH_3/N_2$ gas.

FIG. 7 shows the relationship between the distance in the depth direction and the atomic concentration for the film type c shown in FIG. 6(a) (containing about 30% of each of the silicon component, the carbon component, and the oxygen component, and about 5% of the nitrogen component) of the organic/inorganic hybrid film 104 observed when plasma processing was performed using plasma of a mixed gas of ammonia gas and nitrogen gas. As is found from FIG. 7, in the surface portion of the organic/inorganic hybrid film 104 (portion having a depth of about 20 nm from the surface), the oxygen component increases to about 65% while the carbon component decreases to 5% or less, with the silicon component and the nitrogen component being kept unchanged. From these results, it is found that the surface portion of the organic/inorganic hybrid film 104 was reformed to have a composition close to that of a silicon oxide ($SiO_2$) film. Also found is that it is only the surface portion of the organic/inorganic hybrid film 104 that was reformed with the other portion thereof being kept non-reformed. Therefore, the specific dielectric constant of the organic/inorganic hybrid film 104 remains low.

Hereinafter, the etching gas used for the plasma etching method will be described.

Normally, a main etching gas used for plasma etching of a $SiO_2$ film is a CF gas such as $CF_4$, $C_2F_6$, $C_2F_4$, $C_3F_6$, $C_3F_8$, $C_4F_6$, $C_4F_8$ (straight-chain or cyclic), and $C_5F_8$ (straight-chain or cyclic). A CHF gas such as $CHF_3$, $CH_2F_2$, and $CH_3F$ is also used as a main etching gas or an added gas for plasma etching of the $SiO_2$ film. In general, any of these main etching gases is seldom used singularly or in combination with other main etching gases only. Instead, a rare gas (He, Ar, Ne, Kr, Xe, etc.) or $O_2$ gas is often mixed in the main etching gas. The rare gas is mixed for the purposes of diluting the etching gas, increasing the discharge rate of the gas in the reaction chamber, and controlling the electron temperature of the plasma, among others. The $O_2$ gas is often added for the purpose of removing a polymer film appropriately in the case that the polymer film may possibly be excessively formed on the wafer surface if only the main etching gas is used. Moreover, CO, $CO_2$, SO, $SO_2$, and the like may sometimes be added for the purpose of improving the etching ability of a resist pattern as an etching mask for the $SiO_2$ film or improving the etching selection ratio of the $SiO_2$ film to an underlying film (ratio of the etching rate of the $SiO_2$ film to that of an underlying film). By using a gas obtained by combining the gases described above, it is possible to perform suitable etching for the $SiO_2$ film that meets the requirements in the process.

However, any of combinations of gasses described above fails to suitably etch an organic/inorganic hybrid $SiO_2$ film. In order to attain etching suitable for an organic/inorganic hybrid $SiO_2$ film, the etching method of the present invention is inevitably required.

The etching method of the first embodiment is based on the mechanism that etching is performed by repeating alternately in a microscopic sense (simultaneously in a macroscopic sense) the processes of: reacting an organic component in an organic/inorganic hybrid film with nitrogen-containing molecules on the etching reaction surface of the organic/inorganic hybrid film and removing a reaction product; and reacting silicon in the organic/inorganic hybrid film with a gas containing fluorine and carbon and removing a reaction product.

As described above, as the etching gas used in the first embodiment, usable is a gas including a main etching gas capable of etching a $SiO_2$ film, which is either a gas containing fluorine and carbon or a gas containing fluorine, carbon, and hydrogen, into which a gas containing a nitrogen component is mixed.

Examples of the gas containing a nitrogen component mixed in the main etching gas include a single gas of nitrogen ($N_2$), compounds of nitrogen and hydrogen ($NH_3$, $N_2H_2$, etc.), compounds of nitrogen and oxygen (NO, $NO_2$, $N_2O$, $N_2O_3$, etc.), compounds of nitrogen and carbon ($C_2N_2$, etc.), compounds of nitrogen and fluorine ($NF_3$, etc.), and compounds of nitrogen, oxygen, and fluorine (NOF, $NO_2F$, etc.).

The compounds of nitrogen and carbon ($C_2N_2$, etc.), with which the effect of the present invention is obtainable, are however not preferable from the standpoint of safety because in the event of gas leakage, the compounds will react with water in the atmosphere and generate prussic acid gas (HCN).

As described in the "SUMMARY OF THE INVENTION", Japanese Laid-Open Patent Publication No. 9-263050 describes a method for etching an "inorganic" $SiO_2$ film containing fluoride or fluoride/nitrogen with an etching gas that is a mixture of a fluorocarbon gas and a gas of a compound of nitrogen and hydrogen.

The feature of the etching method described in Japanese Laid-Open Patent Publication No. 9-263050 is as follows. By generating plasma from the etching gas that is a mixture of a fluorocarbon gas and a gas of a compound of nitrogen and hydrogen, fluorine dissociated from the fluorocarbon and fluorine released from the fluorine-containing "inorganic" $SiO_2$ film are bound with nitrogen or hydrogen. In this way, excessive generation of fluorine is suppressed. By this mechanism, the ratio of the etching rate of the "inorganic" $SiO_2$ film to that of the photoresist mask or the underlying substrate is improved, that is, the etching selection ratio is improved.

As is apparent from the above, the mechanism utilized by the etching method for an organic/inorganic hybrid film of the present invention is completely different from the etching method disclosed in Japanese Laid-Open Patent Publication No. 9-263050.

From the standpoint of eliminating the carbon component form the surface portion of the organic/inorganic hybrid $SiO_2$ film, the reaction on the etching reaction surface of the organic/inorganic hybrid $SiO_2$ film is facilitated more efficiently by adding both nitrogen gas and hydrogen gas than by adding only nitrogen gas. The reason is that by adding nitrogen gas and hydrogen gas, there occurs a reaction changing carbon to HCN or the like that is highly volatile and therefore carbon is easily eliminated. In other words, carbon can be eliminated more efficiently by adding nitrogen gas and hydrogen gas to the etching gas than by adding only nitrogen gas. Thus, by adding hydrogen gas to the etching gas containing fluorine, carbon and nitrogen, it is possible to enhance the efficiency of elimination of the carbon component.

From the standpoint of enabling supply of nitrogen and hydrogen in the plasma, the effect obtained by mixing a nitrogen-containing gas and hydrogen gas separately into the etching gas containing fluorine and carbon is substantially the same as the effect obtained by mixing a gas of a compound of nitrogen and hydrogen into the etching gas.

As described above, the ability of eliminating the carbon component increases by mixing nitrogen and hydrogen into a gas containing fluorine and carbon in the etching method for an organic/inorganic hybrid film. Note that there is a danger of causing explosion and the like if hydrogen gas and oxygen gas are simultaneously added to a gas containing fluorine, carbon and nitrogen. Therefore, if importance is put on safety, no oxygen gas should preferably be added when hydrogen gas is added.

The fluorocarbon gas and the hydrofluorocarbon gas were used exemplified above as the etching gas containing fluorine and carbon mainly used for etching of the inorganic $SiO_2$ film. In the etching method of the present invention, gases that exhibit good properties in etching of the inorganic $SiO_2$ film, such as HFE (hydrofluoro-ether) or HFO (hydrofluoro cyclized olefin), may be used as the etching gas containing fluorine and carbon. These gases have recently received attention as etching gases contributing to prevention of global warming. The etching method of the present invention can also be attained by mixing a nitrogen-containing gas into these gases.

By mixing a gas enabling supply of oxygen in the plasma, such as CO and $CO_2$, into the etching gas containing fluorine, carbon and nitrogen, the surface portion of the organic/inorganic hybrid film 104 can be oxidized or reformed efficiently.

In the case that the gas containing a nitrogen component is replaced with oxygen gas, the carbon component existing in the surface portion of the organic/inorganic hybrid film 104 reacts with the oxygen component, generating carbon monoxide and carbon dioxide. The surface portion is therefore oxidized and thus reformed. However, by adding oxygen gas to the etching gas, the etching rate of the resist pattern 105 increases, thereby reducing the etching selection ratio of the organic/inorganic hybrid film 104 to the resist pattern 105. In addition, with an increased etching rate, the resist pattern 105 itself is etched, and thus the size of the openings of the resist pattern 105 greatly varies. This makes it difficult to form the fine contact holes 104a through the organic/inorganic hybrid film 104 with high size precision.

Thus, in the first embodiment, the organic/inorganic hybrid film 104 is plasma-etched with an etching gas containing fluoride, carbon and nitrogen. Therefore, the organic/inorganic hybrid film 104 can be etched at an etching rate roughly equal to that of a silicon oxide film, and yet can maintain the properties thereof such as the specific dielectric constant and also can secure a good etching selection ratio with respect to the resist pattern 105.

The reformation of the surface portion of the organic/inorganic hybrid film 104 includes removing carbon atoms or hydrogen atoms from the surface portion to obtain a composition close to that of the $SiO_2$ film. This is inevitably accompanied by increase of the specific dielectric constant.

To avoid the above problem, during the etching for the entire organic/inorganic hybrid film 104, it is preferable to use an etching gas containing fluorine, carbon and nitrogen before the etching enters its final stage. At the final stage of the etching, an etching gas containing fluorine and carbon but containing no nitrogen is preferably used. In this way, the organic/inorganic hybrid film 104 can be etched at a high etching rate while the surface portion thereof is being reformed before the final stage of the etching. At the final stage of the etching, the already-reformed surface portion can be etched without increasing the specific dielectric constant. Thus, as the entire etching process, the etching rate can be improved without increasing the specific dielectric constant.

(Second Embodiment)

A plasma etching method of the second embodiment of the present invention carried out using the plasma processing apparatus described above will be described with reference to FIGS. 1, 8, and 9.

First, as in the first embodiment, an interconnection layer is formed on a semiconductor substrate. An etching stopper film is deposited over the entire semiconductor substrate including the interconnection layer. An organic/inorganic hybrid film represented by $SiC_xH_yO_z$ (x>0, y≧0, z≧0) is deposited on the etching stopper film, and a resist pattern is formed on the organic/inorganic hybrid film.

Figure 8:
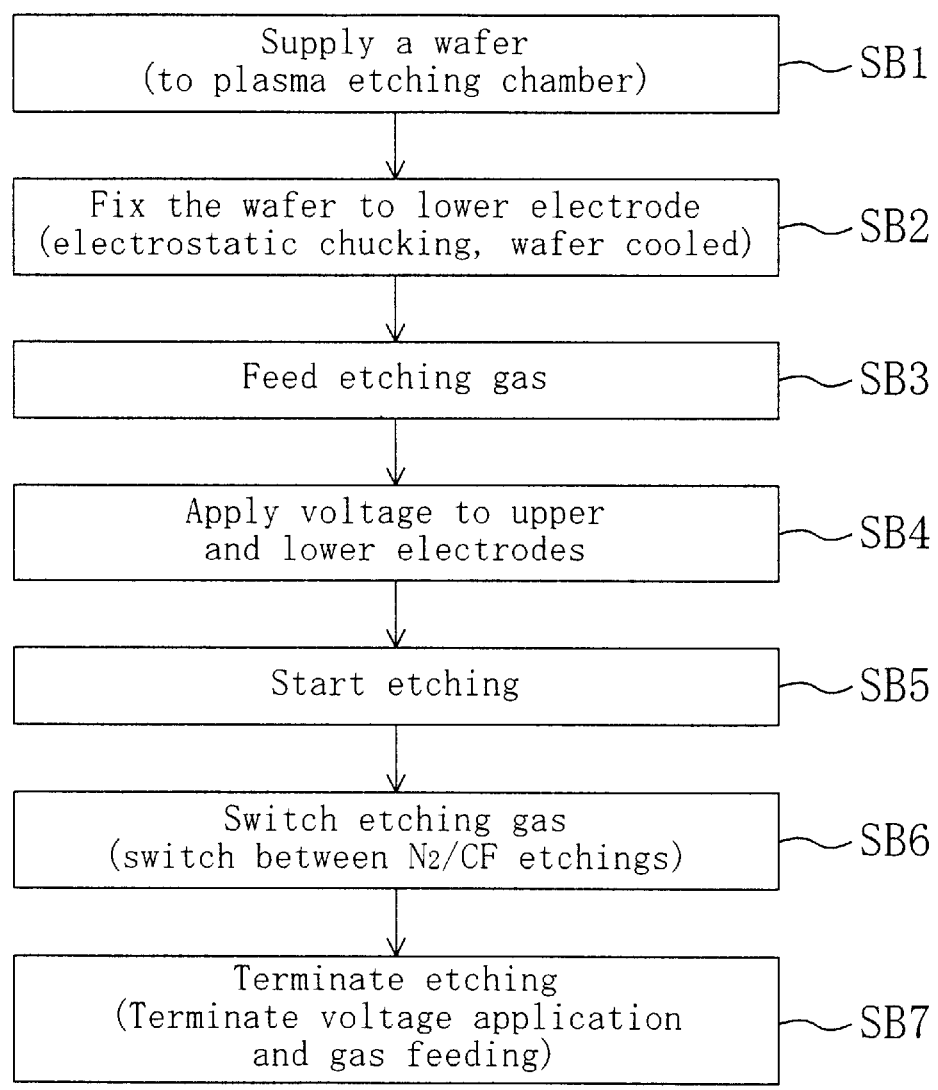
FIG. 8 is a flowchart of an etching method of the second embodiment of the present invention.

Thereafter, in step SB1 shown in FIG. 8, the resultant semiconductor substrate is placed in the reaction chamber 10 of the plasma etching apparatus. In step SB2, the semiconductor substrate is fixed to the lower electrode 11.

In step SB3, a reformation gas and an etching gas are fed into the reaction chamber 10. The kinds and the ways of feeding of the reformation gas and the etching gas are to be described with reference to step SB6.

In step SB4, the first high-frequency power is applied to the plasma induction coil 17 from the first high-frequency source 19, to generate plasma between the lower electrode 11 and the upper electrode 13. Also, the second high-frequency power is applied to the lower electrode 11 from the second high-frequency source 21. With this application, the etching species in the plasma are attracted to the semiconductor substrate 100. As a result, in step SB5, the organic/inorganic hybrid film is plasma-etched.

Figure 9:
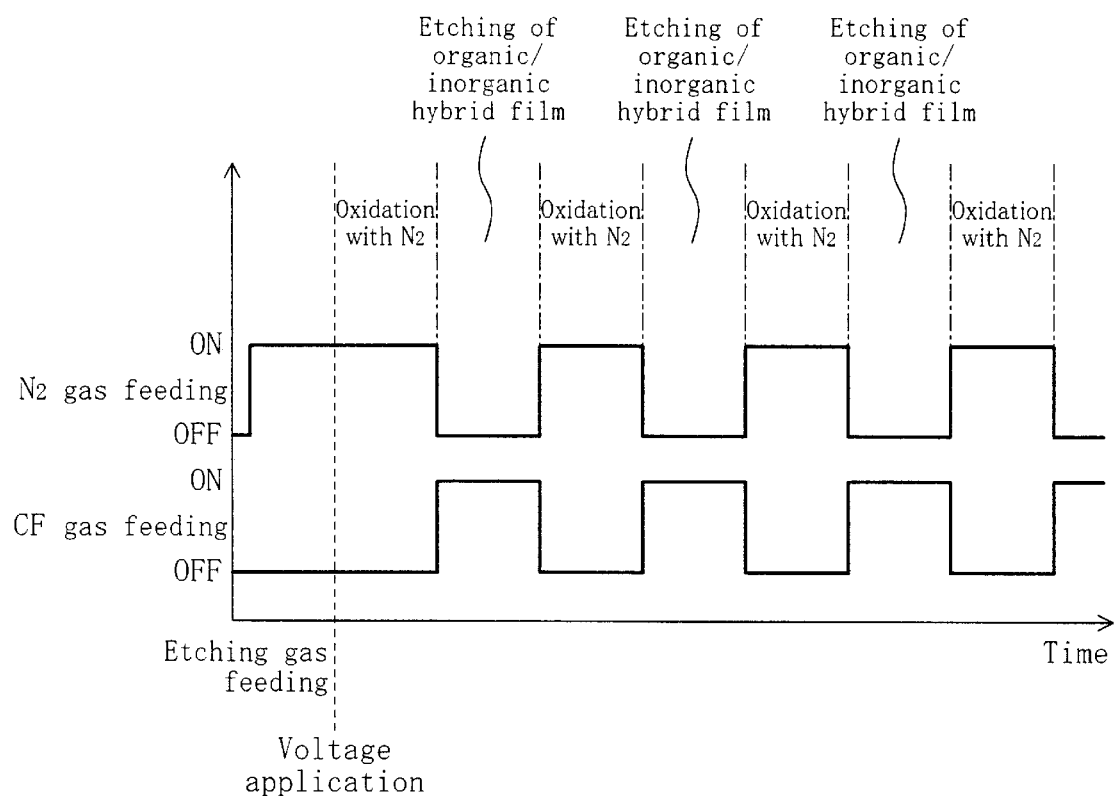
FIG. 9 is a view showing the timing at which a gas containing a $N_2$ component and CF gas are fed in the second embodiment of the present invention.

In step SB6, the feeding of the reformation gas and the etching gas is alternately switched so that the organic/inorganic hybrid film is alternately reformed and etched specifically, as shown in FIG. 9, first, a nitrogen-containing gas is fed as the reformation gas to reform (oxidize) the surface portion of the organic/inorganic hybrid film. The feeding of the nitrogen-containing gas is then stopped, and a CF gas, for example, is fed as the etching gas containing fluorine and carbon to etch the surface portion of the organic/inorganic hybrid film. Thereafter, the reformation process using the nitrogen-containing gas and the etching process using the CF gas are repeated alternately. Note that in the process of reforming the surface portion of the organic/inorganic hybrid film, it is possible to reduce the second high-frequency power applied to the lower electrode 11 from the second high-frequency source 21.

Once the organic/inorganic hybrid film has been etched to a predetermined depth, in step SB7, the application of the high-frequency voltages to the upper electrode 13 and the lower electrode 11 and the feeding of the etching gas are stopped, to finish the etching.

As described above, the etching method of the second embodiment is based on the mechanism that etching is performed by repeating alternately in a macroscopic sense the processes of: reacting an organic component in the organic/inorganic hybrid film with nitrogen-containing molecules on the etching reaction surface of the organic/inorganic hybrid film and removing a reaction product; and reacting silicon in the organic/inorganic hybrid film with a gas containing fluorine and carbon and removing a reaction product. In this etching method, the impetus for the process of reacting an organic component in the organic/inorganic hybrid film with nitrogen-containing molecules is nitrogen and a nitrogen compound generated in the plasma from the gas containing a nitrogen component. Likewise, the impetus for the process of reacting silicon in the organic/inorganic hybrid film with the gas containing fluorine and carbon is fluorine and CF molecules generated in the plasma from the gas containing fluorine and carbon.

In view of the above, in the second embodiment, the gas containing a nitrogen component may be used in the process of reacting an organic component in the organic/inorganic hybrid film with nitrogen-containing molecules, and the etching gas containing fluorine and carbon conventionally used for etching of a $SiO_2$ film may be used in the process of reacting silicon in the organic/inorganic hybrid film with the gas containing fluorine and carbon.

In the second embodiment, also, in the process of reacting an organic component in the organic/inorganic hybrid film with nitrogen-containing molecules, it is effective to use plasma obtained by adding nitrogen and hydrogen. For example, a mixed gas of $H_2$ and $N_2$, $NH_3$ gas, or the like is preferably added to the gas containing fluorine and carbon.

In the second embodiment, the reformation process using the nitrogen-containing gas ($N_2$ gas) and the etching process using the gas containing fluorine and carbon (CF gas) are repeated alternately. Therefore, a carbide generated by reaction between the CF gas and the $SiC_xH_yO_z$ film is prevented from reacting with an nitride as an etching species. As a result, the reformation of the surface portion with the nitrogen-containing gas is made efficiently, and the etching of the reformed surface portion with the CF gas is made efficiently.

The etching method of the second embodiment is also effective in the case that the processing conditions are greatly different between the reformation process and the etching process, such as the case that the preferred gas pressure for the reformation using the nitrogen-containing gas ($N_2$ gas) is different from the preferred gas pressure for the etching using the gas containing fluorine and carbon (CF gas).

As described above, the reformation of the surface portion of the organic/inorganic hybrid film is accompanied by increase in specific dielectric constant. Therefore, the etching process should preferably be the final process in the repetition of the reformation process and the etching process. Also, in the final etching process, the reformed portion should preferably be removed to suppress increase in specific dielectric constant.

Note however that in the case of etching for formation of a contact hole through the organic/inorganic hybrid film on the etching stopper film, the reformed layer (that is, the bottom of the contact hole) is finally removed. Therefore, no increase of the specific dielectric constant occurs.

(Third Embodiment)

A semiconductor device and a fabricating method therefor as the third embodiment of the present invention will be described with reference to FIG. 10(a).

Figure 10A:
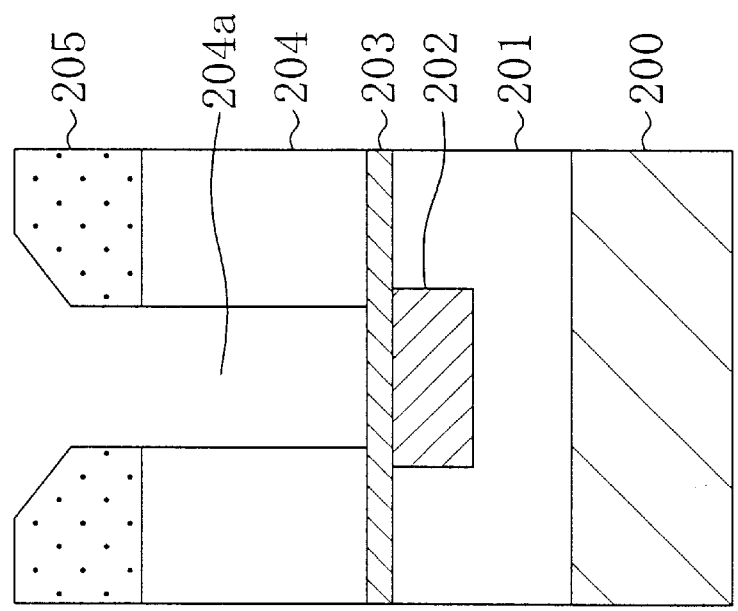
FIG. 10(a) is a cross-sectional view illustrating a fabricating method for a semiconductor device of the third embodiment of the present invention.

As shown in FIG. 10(a), first, an interconnection layer 202 made of a copper film, an alloy film of copper as a main component, or the like is embedded in an insulating film 201 deposited on a semiconductor substrate 200. Although illustration is omitted in FIG. 10(a), the sides and the bottom of the interconnection layer 202 are coated with barrier metal for prevention of metal atoms constituting the interconnection layer 202 from diffusing into the insulating film 201.

An etching stopper film 203 is then deposited on the entire surface of the semiconductor substrate 200 including the interconnection layer 202 by plasma CVD, for example. The etching stopper film 203 is made of a first organic/inorganic hybrid film represented by $SiC_xH_yO_z$ (x>0, y≧0, z≧0) in which the proportion of the carbon component is relatively large.

Subsequently, an interlayer insulating film 204 is deposited on the entire surface of the etching stopper film 203 by plasma CVD, for example. The interlayer insulating film 204 is made of a second organic/inorganic hybrid film represented by $SiC_xH_yO_z$ (x>0, y≧0, z>0) in which the proportion of the carbon component is relatively small.

As the film formation gas for deposition of the etching stopper film 203 and the interlayer insulating film 204, usable is a mixed gas of a material gas such as tetramethylsilane ($Si(CH_3)_4$), dimethyl.dimethylsiloxane ($Si(CH_3)_2(-O-CH_3)_2$), monomethylsilane ($SiH_3(CH_3)$), or Hexamethyldisiloxane ($Si(CH_3)_3-O-Si(CH_3)_3$) and an additive gas such as $N_2O$. In the third embodiment, a mixed gas of hexamethyldisiloxane (HMDSO) and $N_2O$ was fed into a CVD apparatus, to deposit the interlayer insulating film 204 on the semiconductor substrate 200 that is kept at 300° C.

The feature of the third embodiment is that the proportion of the carbon component contained in the first organic/inorganic hybrid film constituting the etching stopper film 203 is larger than the proportion of the carbon component contained in the second organic/inorganic hybrid film constituting the interlayer insulating film 204.

The proportion of the carbon component in the etching stopper film 203 can be made larger than that in the interlayer insulating film 204 in the following manner, for example. The same kind of the material gas (for example, HMDSO) is used as the main component. The proportion of the additive gas (for example, $N_2O$) contained in the film formation gas for deposition of the etching stopper film 203 is reduced, while the proportion of the additive gas contained in the film formation gas for deposition of the interlayer insulating film 204 is increased. Alternatively, a film formation gas including a material gas containing an increased amount of the carbon component may be used for deposition of the etching stopper film 203, while a film formation gas including a material gas containing a reduced amount of the carbon component may be used for deposition of the interlayer insulating film 204.

Thereafter, a resist pattern 205 having openings for formation of contact holes is formed on the interlayer insulating film 204. The interlayer insulating film 204 is then plasma-etched using the resist pattern 205 as a mask.

The same etching gas and etching conditions as those used in the first embodiment are applied for the plasma etching of the interlayer insulating film 204. That is, an etching gas having a volume flow ratio of:

$C_4F_8:CH_2F_2:Ar:CO:N_2=2:1:10:5:0.5$ is fed into the reaction chamber 10 that is kept at a pressure of 2.6 Pa via the gas inlet 14. The first high-frequency power of 1500 W at 13.56 MHz, for example, is applied to the plasma induction coil 17 from the first high-frequency source 19, to generate plasma between the lower electrode 11 and the upper electrode 13. Also, the second high-frequency power of 1400 W at 4 MHz, for example, is applied to the lower electrode 11 from the second high-frequency source 21, to attract the etching species in the plasma to the semiconductor substrate 100 to thereby enable plasma etching.

Thus, as in the first embodiment, the etching species such as $N_2$ in the plasma are attracted to the bottom of the contact hole 204a and react with carbon atoms or hydrogen atoms existing on the bottom. As a result, a reformed layer (oxidized region) where the carbon component has been eliminated is formed on the bottom of the contact hole 204a, and thus the reformed bottom of the contact hole 204b is nicely etched with the etching species such as $CF_x$ contained in the plasma.

Once the etching of the interlayer insulating film 204 has been completed and the underlying etching stopper film 203 is exposed in the contact hole 204a, the etching is blocked due to the following reason. The proportion of the carbon component contained in the etching stopper film 203 is larger than the proportion of the carbon component contained in the interlayer insulating film 204 as described above. Therefore, when the etching stopper film 203 is etched as the etching proceeds, an etching reaction gas containing the carbon component is generated, resulting in deposition of a thick polymer film. In addition, the carbon component of the etching stopper film 203, as well as an excess of the carbon component of the polymer film, is accumulated on the etching stopper film 203, thereby blocking the progress of the etching. This sharply decreases the etching rate, and thus the etching stops at the surface of the etching stopper film 203.

The etching gas contains a fluorine component for cleaving Si—O bonds as described above. This fluorine component in the etching gas is scavenged by the carbon component contained in the etching stopper film 203. More specifically, the fluorine contained in the etching gas reacts with a carbide such as a methyl group contained in the etching stopper film 203, to produce a fluorocarbon compound. By this reaction, the amount of the fluorine component contained in the etching gas is reduced, and therefore cleaving of the Si—O bonds in the etching stopper film 203 becomes less easy. This sharply decreases the etching rate, and thus the etching stops at the surface of the etching stopper film 203.

Thus, in the third embodiment, the etching stopper film 203 made of the second organic/inorganic hybrid film having a relatively large proportion of the carbon component is formed under the interlayer insulating film 204 made of the first organic/inorganic hybrid film having a relatively small proportion of the carbon component. Such an etching stopper film 203 can serve as the etching stopper for the interlayer insulating film 204, and moreover can provide a significantly small specific dielectric constant compared with the conventional etching stopper film made of a silicon nitride.

In the third embodiment, if the etching stopper film 203 contains an oxygen component, the interconnection layer 202 may possibly be oxidized with the oxygen component although slightly. Therefore, when the etching stopper film 203 is made of an organic/inorganic hybrid film represented by $SiC_xH_yO_z$ (x>0, y≧0, z>0), the film is preferably an insulating film containing no oxygen component (that is, z=0).

In the third embodiment, the thickness of the etching stopper film 203 is preferably about 50 nm when the thickness of the interlayer insulating film 204 is about 800 nm. By this setting, a sufficient etching selection ratio can be secured for the etching stopper film 203.

(Modification of the Third Embodiment)

A semiconductor device and a fabricating method therefor as a modification of the third embodiment of the present invention will be described with reference to FIG. 10(b).

Figure 10B:
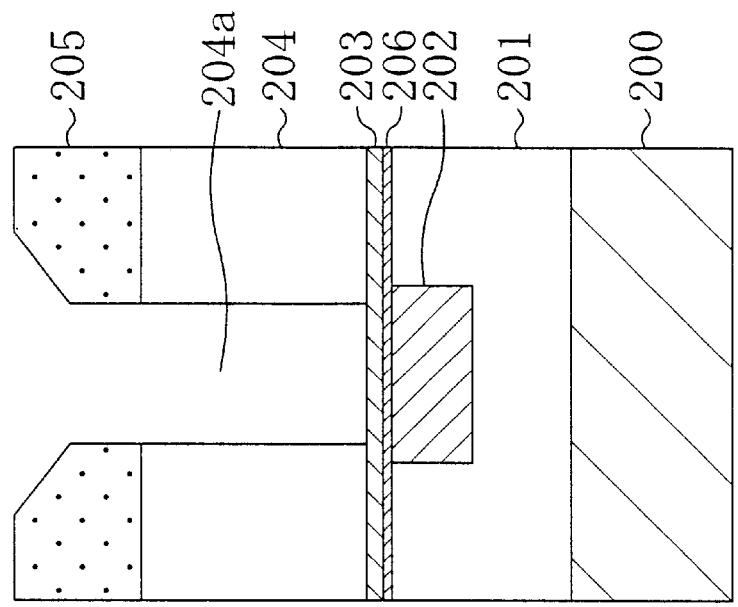
FIG. 10(b) is a cross-sectional view illustrating a fabricating method for a semiconductor device of a modification of the third embodiment of the present invention.

The feature of the modification of the third embodiment is that, as shown in FIG. 10(b), a protection film 206 made of a silicon nitride film, a silicon carbide film, or the like having a thickness of 10 nm, for example, is formed between the interconnection layer 202 and the etching stopper film 203.

As described above, if the etching stopper film 203 is made of an organic/inorganic hybrid film containing an oxygen component, the interconnection layer 202 may possibly be oxidized with the oxygen component although slightly.

In the modification of the third embodiment, the protection layer 206 containing no oxygen component is provided between the interconnection layer 202 and the etching stopper film 203. The interconnection layer 202 is therefore prevented from being oxidized reliably even when the etching stopper film 203 contains an oxygen component.

The thickness of the protection film 206 is so small that increase in the specific dielectric constant between the lower and upper interconnections is prevented even when the protection film 206 has a more or less high specific dielectric constant.

In the third embodiment including the modification thereof, the interconnection layer 202 was of an embedded type. In the case that the interconnection layer 202 is formed by patterning a conductive film, also, the effects of the third embodiment and the modification thereof can be obtained.

(Fourth Embodiment)

A semiconductor device and a fabricating method therefor of the fourth embodiment will be described with reference to FIGS. 11(a) to 11(c).

Figure 11C:
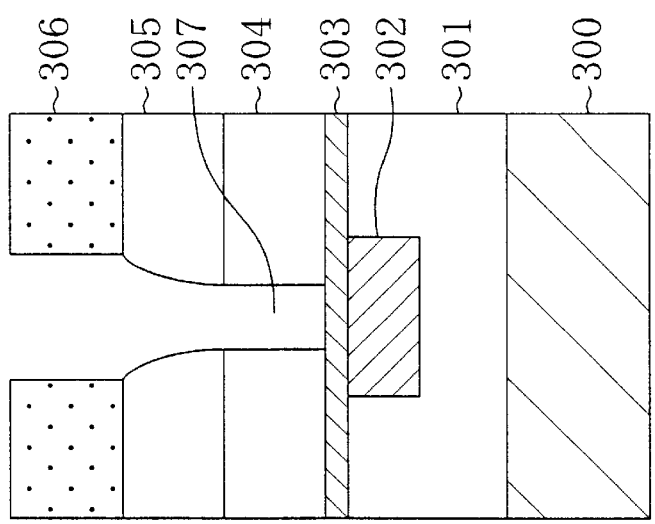
FIGS. 11(a) through 11(c) are cross-sectional views of process steps of a fabricating method for a semiconductor device of the fourth embodiment of the present invention.
Figure 11B:
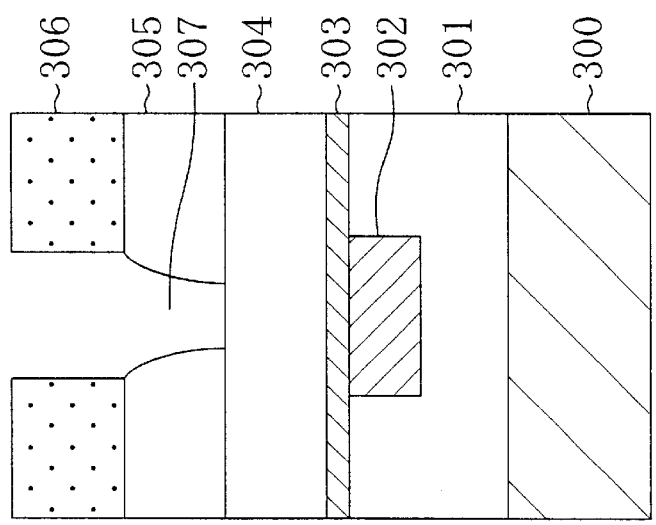
Figure 11A:
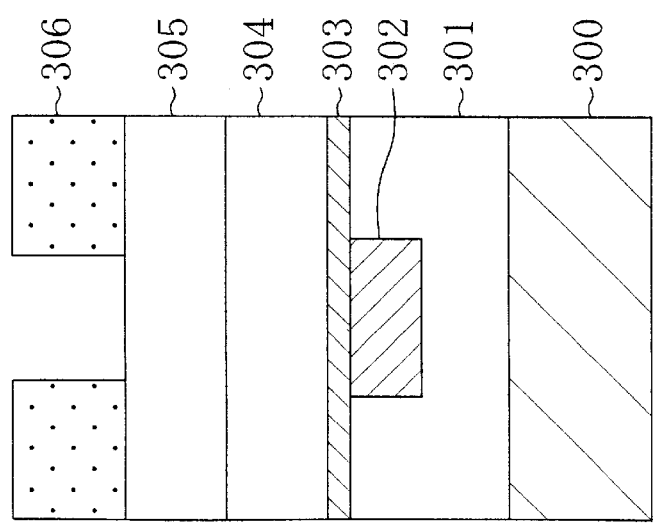

First, as shown in FIG. 11(a), an interconnection layer 302 made of a copper film, an alloy film of copper as a main component, or the like is embedded in an insulating film 301 deposited on a semiconductor substrate 300.

An etching stopper film 303 is then deposited on the entire surface of the interconnection layer 302 by plasma CVD, for example. The etching stopper film 303 is made of a first organic/inorganic hybrid film represented by $SiC_xH_yO_z$ (x>0, y≧0, z≧0) in which the proportion of the carbon component is largest.

Subsequently, a lower interlayer insulating film (first interlayer insulating film) 304 is deposited on the entire surface of the etching stopper film 303 by plasma CVD, for example. The lower interlayer insulating film 304 is made of a second organic/inorganic hybrid film represented by $SiC_xH_yO_z$ (x>0, y≧0, z>0) in which the proportion of the carbon component is smallest.

An upper interlayer insulating film (second interlayer insulating film) 305 is then deposited on the entire surface of the lower interlayer insulating film 304 by plasma CVD, for example. The upper interlayer insulating film 305 is made of a third organic/inorganic hybrid film represented by $SiC_xH_yO_z$ (x>0, y≧0, z>0) in which the proportion of the carbon component is intermediate.

As the film formation gas for deposition of the etching stopper film 303, the lower interlayer insulating film 304, and the upper interlayer insulating film 305, usable is a mixed gas of a material gas such as tetramethylsilane ($Si(CH_3)_4$), dimethyl.dimethylsiloxane ($Si(CH_3)_2(—O—CH_3)_2$), monomethylsilane ($SiH_3(CH_3)$), or Hexamethyldisiloxane ($Si(CH_3)_3—O—Si(CH_3)_3$) and an additive gas such as $N_2O$. In the fourth embodiment, a mixed gas of hexamethyldisiloxane (HMDSO) and $N_2O$ was used.

The proportion of the carbon component is made smaller in the order of the first organic/inorganic hybrid film constituting the etching stopper film 303, the third organic/inorganic hybrid film constituting the upper interlayer insulating film 305, and the second organic/inorganic hybrid film constituting the lower interlayer insulating film 304, in the following manner, for example. While the same kind of the material gas (for example, HMDSO) is used as the main component, the proportion of the additive gas (for example, $N_2O$) contained in the film formation gas is increased or decreased. Alternatively, a film formation gas including a material gas containing an increased or decreased amount of the carbon component may be selected.

Thereafter, a resist pattern 306 having openings for formation of contact holes is formed on the upper interlayer insulating film 305. The upper and lower interlayer insulating films 305 and 304 are sequentially plasma-etched using the resist pattern 306 as a mask.

The same etching gas and etching conditions as those used in the first embodiment are applied for the plasma etching of the upper and lower interlayer insulating films 305 and 304. That is, an etching gas having a volume flow ratio of:

$C_4F_8:CH_2F_2:Ar:CO:N_2$=2:1:10:5:0.5 is fed into the reaction chamber that is kept at a pressure of 2.6 Pa, and plasma of the etching gas is generated to enable plasma etching.

Under the above conditions, etching proceeds for the upper interlayer insulating film 305 in the following manner. The etching species such as $N_2$ contained in the plasma react with carbon atoms or hydrogen atoms existing on the bottom of the contact hole 307 to reform the bottom during the etching. Since the upper interlayer insulating film 305 contains the carbon component in an intermediate proportion, an etching reaction gas containing the carbon component is generated in an intermediate amount during the etching of the interlayer insulating film 305. This facilitates deposition of a polymer film on the wall and the bottom of the contact hole 307. In addition, the carbon component in the interlayer insulating film 305 impedes progress of the etching. The etching rate therefore decreases toward the bottom of the contact hole 307. Therefore, the amount of polymer deposited on the wall is greater than the amount of progress of the etching toward the bottom. As a result, as shown in FIG. 11(b), the diameter of the contact hole 307 is smaller toward to the bottom.

Subsequently, in the plasma etching for the lower interlayer insulating film 304, etching proceeds in the following manner. The etching species such as $N_2$ contained in the plasma react with carbon atoms or hydrogen atoms existing on the bottom of the contact hole 307 to reform the bottom during the etching. The deposition of a polymer film and the etching proceed competing with each other on the bottom of the contact hole 307. However, since the lower interlayer insulating film 304 contains the carbon component in the smallest proportion, the carbon component contained in an etching reaction gas generated during the etching of the interlayer insulating film 304 is small, and thus the amount of the polymer film deposited on the wall and the bottom of the polymer film deposited on the wall and the bottom of the contact hole 307 is small. Moreover, the carbon component on the surface of the interlayer insulating film 304 at the bottom of the contact hole 307 has been sufficiently eliminated, and thus the etching rate does not decrease toward the bottom. Therefore, the etching rate at the bottom of the contact hole 307 is large, and the amount of the polymer film deposited on the wall is sufficiently small. As a result, as shown in FIG. 11(c), the etching proceeds with the diameter of the contact hole 307 being kept constant.

As a result of the above etching process, as shown in FIG. 11(c), the wall of the contact hole 307 expands in a tapered shape near the opening thereof and stands vertical near the bottom thereof. With this shape of the contact hole, when a conductive film is deposited on the upper interlayer insulating film 305 after removal of the resist pattern 306, the contact hole 307 is reliably filled with the conductive film.

In the fourth embodiment, the proportion of the carbon component contained in the upper interlayer insulating film 305 is made larger than that in the lower interlayer insulating film 304. This makes it possible to reliably form the contact hole 307 having a wall that expands in a tapered shape near the opening and stands vertical near the bottom, without the necessity of changing the etching conditions.

In the fourth embodiment, also, by adjusting the thicknesses of the upper interlayer insulating film 305 and the lower interlayer insulating film 304, it is possible to reliably control the heights of the portion of the contact hole 307 having a tapered wall and the portion thereof having a vertical wall.

In the fourth embodiment, the proportion of the carbon component contained in the lower and upper interlayer insulating films 304 and 305 was changed in stages. Alternatively, the proportion of the carbon component contained in the organic/inorganic hybrid film may be changed continuously.

In the fourth embodiment, the etching stopper film 303 made of the first organic/inorganic hybrid film having the largest proportion of the carbon component was provided under the lower interlayer insulating film 304. Alternatively, an etching stopper film made of a silicon nitride film, for example, may be provided.

(Fifth Embodiment)

A semiconductor device and a fabricating method therefor of the fifth embodiment will be described with reference to FIGS. 12(a) to 12(c).

Figure 12C:
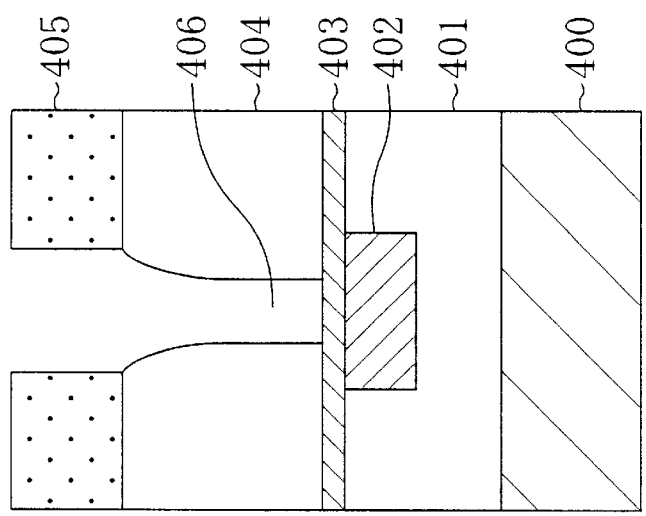
FIGS. 12(a) through 12(c) are cross-sectional views of process steps of a fabricating method for a semiconductor device of the fifth embodiment of the present invention.
Figure 12B:
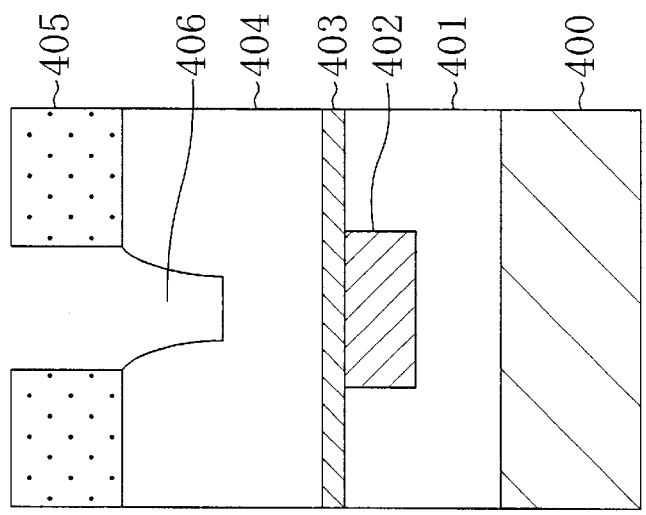
Figure 12A:
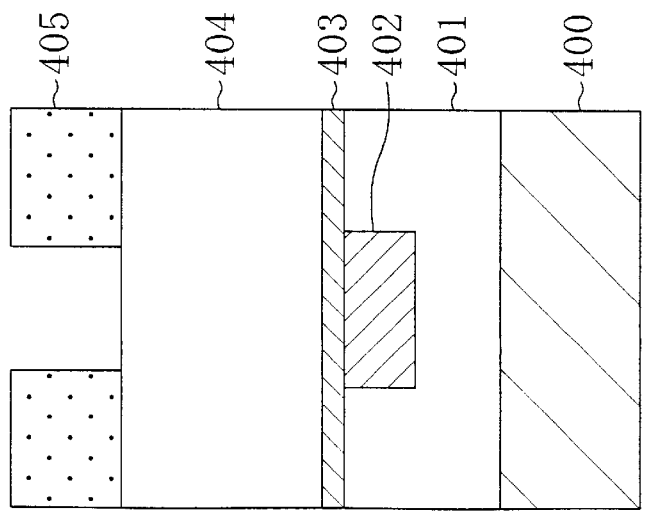

First, as shown in FIG. 12(a), an interconnection layer 402 made of a copper film, an alloy film of copper as a main component, or the like is embedded in an insulating film 401 deposited on a semiconductor substrate 400.

An etching stopper film 403 is then deposited on the entire surface of the interconnection layer 402 by plasma CVD, for example. The etching stopper film 403 is made of a first organic/inorganic hybrid film represented by $SiC_xH_yO_z$ (x>0, y≧0, z>0) in which the proportion of the carbon component is relatively large.

Subsequently, an interlayer insulating film 404 is deposited on the entire surface of the etching stopper film 403 by plasma CVD, for example. The interlayer insulating film 404 is made of a second organic/inorganic hybrid film represented by $SiC_xH_yO_z$ (x>0, y≧0, z>0) in which the proportion of the carbon component is relatively small.

As the film formation gas for deposition of the etching stopper film 403 and the interlayer insulating film 404, usable is a mixed gas of a material gas such as tetramethylsilane ($Si(CH_3)_4$), dimethyl.dimethylsiloxane ($Si(CH_3)_2$(—O—$CH_3)_2$), monomethylsilane ($SiH_3(CH_3)$), or Hexamethyldisiloxane ($Si(CH_3)_3$—O—$Si(CH_3)_3$) and an additive gas such as $N_2O$. In the fifth embodiment, a mixed gas of hexamethyldisiloxane (HMDSO) and $N_2O$ was used.

The proportion of the carbon component in the etching stopper film 403 can be made larger than that in the interlayer insulating film 404 in the following manner, for example. The same kind of the material gas (for example, HMDSO) is used as the main component. The proportion of the additive gas (for example, $N_2O$) contained in the film formation gas for deposition of the etching stopper film 403 is reduced, while the proportion of the additive gas contained in the film formation gas for deposition of the interlayer insulating film 404 is increased. Alternatively, a film formation gas including a material gas containing an increased amount of the carbon component may be used for deposition of the etching stopper film 403, while a film formation gas including a material gas containing a reduced amount of the carbon component may be used for deposition of the interlayer insulating film 404.

Thereafter, a resist pattern 405 having openings for formation of contact holes is formed on the interlayer insulating film 404. The interlayer insulating film 404 is then plasma-etched using the resist pattern 405 as a mask.

Hereinafter, the plasma etching method will be described in detail.

Figure 13:
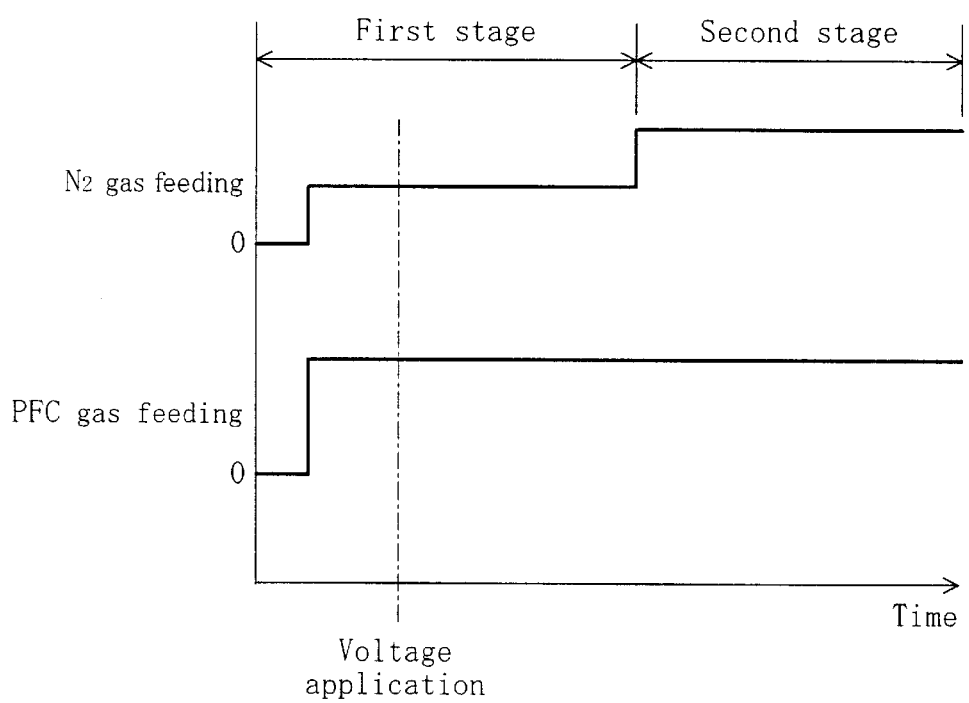
FIG. 13 is a view showing the timing at which a gas containing a $N_2$ component and CF gas are fed in the fifth embodiment of the present invention.

First, as shown in FIG. 13, first-stage etching is carried out. That is, an etching gas containing fluorine, carbon and nitrogen is fed into the reaction chamber. High-frequency power is applied to the plasma induction coil, to generate plasma of the etching gas. The plasma is then attracted to the semiconductor substrate 400.

Under the above conditions, etching proceeds in the following manner. The etching species such as $N_2$ contained in the plasma react with carbon atoms or hydrogen atoms existing on the bottom of a contact hole 406 (see FIG. 12(b)) to reform the bottom during the etching. Since the amount of the $N_2$ component contained in the etching gas is small, the carbon component of the interlayer insulating film 404 is less eliminated at the bottom of the contact hole 406. This impedes progress of the etching toward the bottom, and thus the etching rate toward the bottom of the contact hole 406 decreases. Therefore, the amount of a polymer film deposited on the wall is greater than the amount of progress of the etching toward the bottom, and thus, as shown in FIG. 12(b), the diameter of the contact hole 407 is smaller toward the bottom.

Subsequently, second-stage etching is carried out as shown in FIG. 13. That is, the added amount of the $N_2$ gas to the etching gas fed into the reaction chamber is increased so that the proportion of $N_2$ is as large as that in the first embodiment (volume flow ratio of $N_2$ gas/volume flow ratio of CF gas is relatively large).

The above etching proceeds while the etching species such as $N_2$ contained in the plasma react with carbon atoms or hydrogen atoms existing on the bottom of the contact hole 406 thereby reforming the bottom. Since the amount of the $N_2$ gas contained in the etching gas is large, the carbon component at the surface of the interlayer insulating film 404 on the bottom of the contact hole 406 has been sufficiently eliminated. Therefore, the etching rate toward the bottom does not decrease. In addition, the amount of the polymer film deposited on the wall of the contact hole 406 is sufficiently small. Thus, the etching proceeds with the diameter of the contact hole 406 being kept constant.

As a result, as shown in FIG. 12(c), formed is the contact hole 406 of which the wall expands in a tapered shape near the opening and stands vertical near the bottom. Therefore, when a conductive film is deposited on the interlayer insulating film 404 after removal of the resist pattern 405, the contact hole 406 is reliably filled with the conductive film.

In the fifth embodiment, the amount of the $N_2$ gas added to the etching gas is increased during the etching. This makes it possible to reliably form the contact hole 406 of which the wall expands in a tapered shape near the opening and stands vertical near the bottom, without changing the composition of the interlayer insulating film 404.

In the fifth embodiment, the added amount of the $N_2$ gas was changed in stages. Alternatively, the added amount of the $N_2$ gas may be change continuously.

In the fifth embodiment, the etching stopper film 403 made of the first organic/inorganic hybrid film in which the proportion of the carbon component was relatively large was formed under the interlayer insulating film 404. Alternatively, an etching stopper film made of a silicon nitride film, for example, may be provided.

(Sixth Embodiment)

A semiconductor device and a fabricating method therefor of the sixth embodiment will be described with reference to FIGS. 14(a) to 14(c) and 15(a) to 15(d).

Figure 14A:
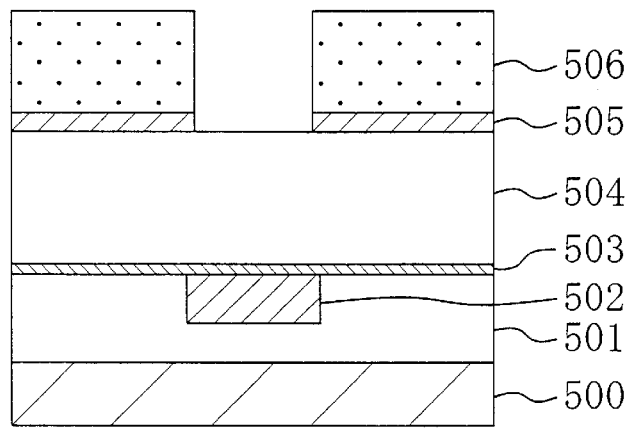
FIGS. 14(a) through 14(c) are cross-sectional views of process steps of a fabricating method for a semiconductor device of the sixth embodiment of the present invention.

First, as shown in FIG. 14(a), a lower interconnection 502 made of a copper film, an alloy film of copper as a main component, or the like is embedded in an insulating film 501 deposited on a semiconductor substrate 500. An etching stopper film 503 having a thickness of 50 nm is then deposited on the entire surface of the lower interconnection 502. The etching stopper film 503 is made of a first organic/inorganic hybrid film represented by $SiC_xH_yO_z$ (x>0, y≧0, z≧0) in which the proportion of the carbon component is relatively large.

Subsequently, an interlayer insulating film 504 is deposited on the etching stopper film 503 by plasma CVD, for example. The interlayer insulating film 504 is made of a second organic/inorganic hybrid film represented by $SiC_xH_yO_z$ (x>0, y≧0, z>0) in which the proportion of the carbon component is relatively small.

As the film formation gas for deposition of the etching stopper film 503 and the interlayer insulating film 504, usable is a mixed gas of a material gas such as tetramethylsilane ($Si(CH_3)_4$), dimethyl.dimethylsiloxane ($Si(CH_3)_2$(—O—CH$_3$)$_2$), monomethylsilane ($SiH_3(CH_3)$), or Hexamethyldisiloxane ($Si(CH_3)_3$—O—$Si(CH_3)_3$) and an additive gas such as $N_2O$.

The proportion of the carbon component in the etching stopper film 503 can be made larger than that in the interlayer insulating film 504 in the following manner, for example. The same kind of the material gas (for example, HMDSO) is used as the main component. The proportion of the additive gas (for example $N_2O$) contained in the film formation gas for deposition of the etching stopper film 503 is reduced, while the proportion of the additive gas contained in the film formation gas for deposition of the interlayer insulating film 504 is increased. Alternatively, a film formation gas including a material gas containing an increased amount of the carbon component may be used for deposition of the etching stopper film 503, while a film formation gas including a material gas containing a reduced amount of the carbon component may be used for deposition of the interlayer insulating film 504.

Subsequently, a CMP stopper film 505 made of a silicon nitride film, for example, is deposited on the interlayer insulating film 504. A resist pattern 506 having openings for formation of contact holes is formed on the CMP stopper film 505. The CMP stopper film 505 is then etched using the resist pattern 506 as a mask, so that the openings of the resist pattern 506 are transferred to the CMP stopper film 505.

Figure 14B:
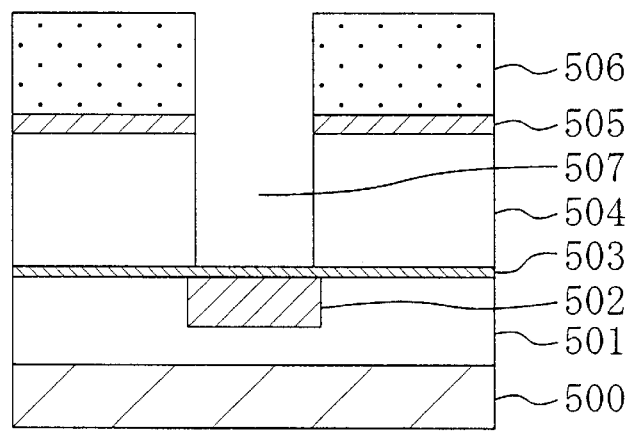

Referring to FIG. 14(b), the interlayer insulating film 504 is plasma-etched using the resist pattern 506 as a mask.

The conditions of this plasma etching are substantially the same as those used in the first embodiment. That is, the etching gas containing fluorine, carbon and nitrogen is fed into the reaction chamber, and high-frequency power is applied to the plasma induction coil to generate plasma of the etching gas.

Under the above conditions, the etching proceeds in the following manner. The etching species such as $N_2$ contained in the plasma react with carbon atoms or hydrogen atoms existing on the bottom of a contact hole 507 to reform the bottom during the etching. That is, the bottom (reformed layer) of the contact hole 507 has a composition close to that of $SiO_2$, and therefore is nicely etched with the etching species such as $CF_x$ contained in the plasma.

Figure 14C:
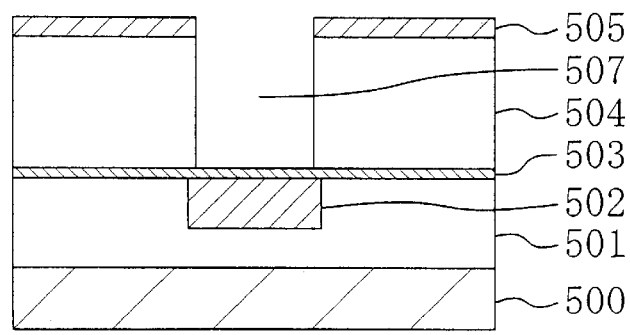
Figure 15A:
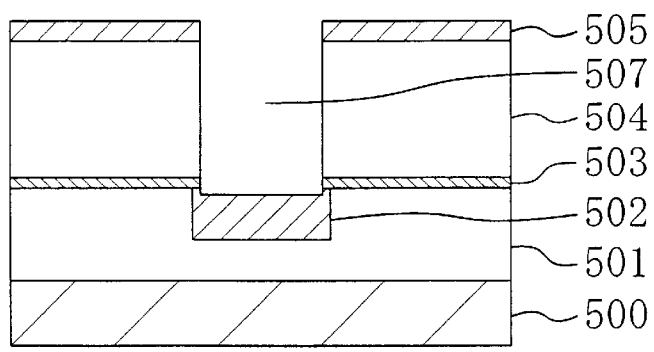
FIGS. 15(a) through 15(d) are cross-sectional views of process steps of the fabricating method for a semiconductor device of the sixth embodiment of the present invention.

Referring to FIG. 14(c), the resist pattern 506 is removed. Referring to FIG. 15(a), the etching stopper film 503 is etched using the CMP stopper film 505 having openings as a mask. By this etching, the portion of the etching stopper film 503 exposed in the contact hole 507 is removed. Since the etching stopper film 503 is over-etched, a shallow concave portion is formed at the surface of the lower interconnection 502.

Figure 15B:
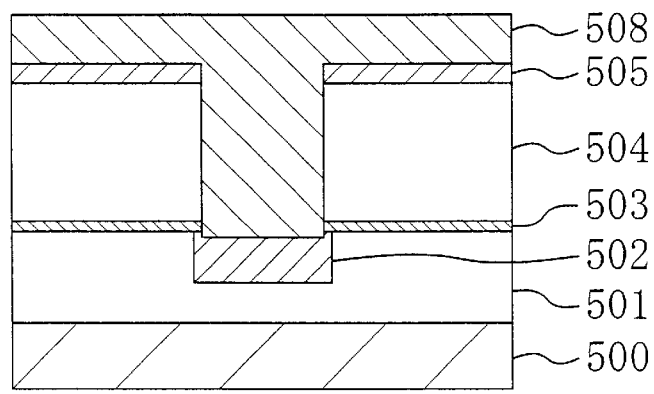
Figure 15C:
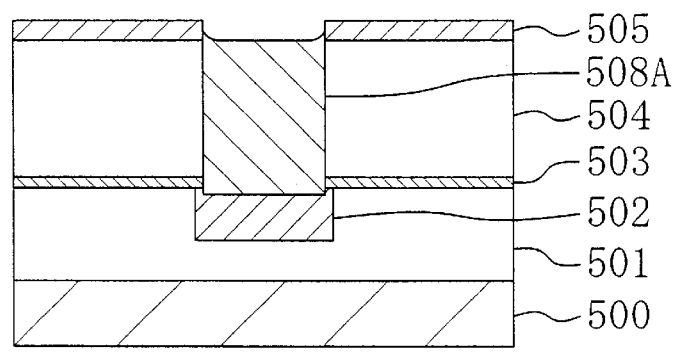

Referring to FIG. 15(b), a metal film 508 made of a copper film, a tungsten film, or the like is deposited on the entire surface of the CMP stopper film 505. The portion of the metal film 508 exposed on the CMP stopper film 505 is then removed by CMP, to form a plug 508A made of the metal film 508 as shown in FIG. 15(c). A dishing phenomenon occurs at the surface of the plug 508A, so that the surface of the plug 508A is recessed by a depth roughly equal to the thickness of the CMP stopper film 505.

Figure 15D:
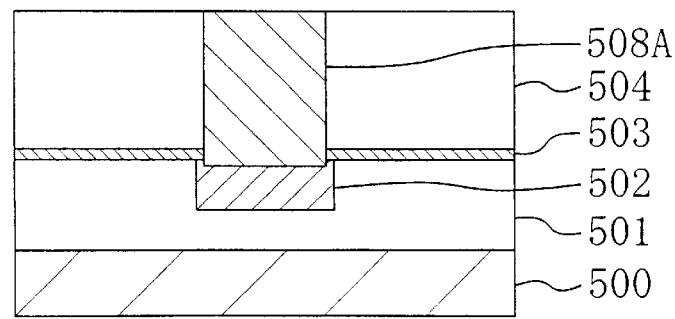

Referring to FIG. 15(d), when the CMP stopper film 505 is removed by etching, the surface of the plug 508A is flat and flush with the surface of the interlayer insulating film 504. In the case of a multilayer interconnection structure, the flatness of upper interconnections can be improved.

If no dishing phenomenon occurs at the surface of the plug 508A, or if the thickness of the CMP stopper film 505 is larger than the dishing amount, the surface portion of the plug 508A protrudes from the interlayer insulating film 504 after the removal of the CMP stopper film 505. Such a protrusion may be used as an alignment mark in an alignment process for formation of upper interconnections if the flatness of the resultant upper interconnections is within a permissible range.

In the sixth embodiment, the contact hole 507 can be reliably formed through the interlayer insulating film 504 made of the organic/inorganic hybrid film having a low specific dielectric constant. In addition, CMP can be performed nicely for the interlayer insulating film 504 made of an organic/inorganic hybrid film considered poor in CMP resistance because the interlayer insulating film 504 is protected with the CMP stopper film 505 during the CMP process.

Moreover, the etching stopper film 503 made of the organic/inorganic hybrid film having a larger proportion of the carbon component is formed under the interlayer insulating film 504. This etching stopper film 503, which serves as the etching stopper for the interlayer insulating film 504, is significantly small in specific dielectric constant compared with the conventional etching stopper film made of a silicon nitride film.

(Seventh Embodiment)

A semiconductor device and a fabricating method therefor of the seventh embodiment of the present invention will be described with reference to FIGS. 16(*a*) to 16(*c*), 17(*a*) to 17(*c*), and 18(*a*) to 18(*d*).

Figure 16A:
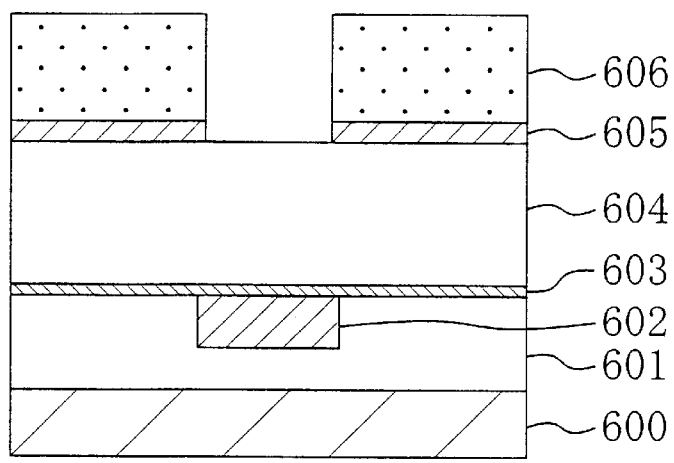
FIGS. 16(a) through 16(c) are cross-sectional views of process steps of a fabricating method for a semiconductor device of the seventh embodiment of the present invention.
Figure 16B:
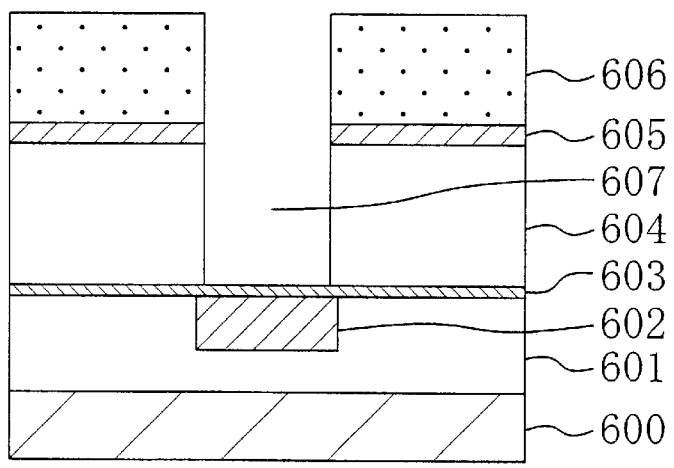
Figure 16C:
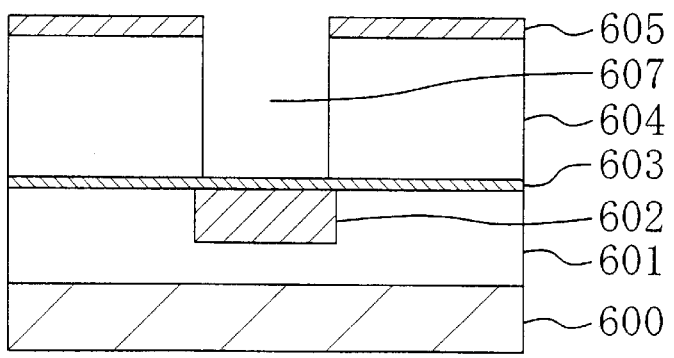

First, as shown in FIG. 16(*a*), a lower interconnection 602 made of a copper film, an alloy film of copper as a main component, or the like is embedded in an insulating film 601 deposited on a semiconductor substrate 600. An etching stopper film 603 having a thickness of 50 nm is then deposited on the entire surface of the lower interconnection 602. The etching stopper film 603 is made of a first organic/inorganic hybrid film represented by $SiC_xH_yO_z$ ($x>0$, $y \geqq 0$, $z>0$) in which the proportion of the carbon component is relatively large.

Subsequently, an interlayer insulating film 604 is deposited on the etching stopper film 603 by plasma CVD, for example. The interlayer insulating film 604 is made of a second organic/inorganic hybrid film represented by $SiC_xH_yO_z$ ($x>0$, $y \geqq 0$, $z>0$) in which the proportion of the carbon component is relatively small.

As the film formation gas for deposition of the etching stopper film 603 and the interlayer insulating film 604, usable is a mixed gas of a material gas such as tetramethylsilane ($Si(CH_3)_4$), dimethyl.dimethylsiloxane ($Si(CH_3)_2$(—O—$CH_3)_2$), monomethylsilane ($SiH_3(CH_3)$), or Hexamethyldisiloxane ($Si(CH_3)_3$O—$Si(CH_3)_3$) and an additive gas such as $N_2O$.

The proportion of the carbon component in the etching stopper film 603 can be made larger than that in the interlayer insulating film 604 in the following manner, for example. The same kind of the material gas (for example, HMDSO) is used as the main component. The proportion of the additive gas (for example $N_2O$) contained in the film formation gas for deposition of the etching stopper film 603 is reduced, while the proportion of the additive gas contained in the film formation gas for deposition of the interlayer insulating film 604 is increased. Alternatively, a film formation gas including a material gas containing an increased amount of the carbon component may be used for deposition of the etching stopper film 603, while a film formation gas including a material gas containing a reduced amount of the carbon component may be used for deposition of the interlayer insulating film 604.

Subsequently, a CMP stopper film 605 made of a silicon nitride film, for example, is deposited on the interlayer insulating film 604. A first resist pattern 606 having openings for formation of contact holes is formed on the CMP stopper film 605. The CMP stopper film 605 is then etched using the first resist pattern 606 as a mask, so that the openings of the first resist pattern 606 are transferred to the CMP stopper film 605.

Referring to FIG. 16(*b*), the interlayer insulating film 604 is plasma-etched using the first resist pattern 606 as a mask.

The conditions of this plasma etching are substantially the same as those used in the first embodiment. That is, the etching gas containing fluorine, carbon and nitrogen is fed into the reaction chamber, and high-frequency power is applied to the plasma induction coil to generate plasma of the etching gas.

Under the above conditions, the etching proceeds in the following manner. The etching species such as $N_2$ contained in the plasma react with carbon atoms or hydrogen atoms existing on the bottom of a contact hole 607 to reform the bottom during the etching. That is, the bottom (reformed layer) of the contact hole 607 has a composition close to that of $SiO_2$, and therefore is nicely etched with the etching species such as $CF_x$ contained in the plasma.

Figure 17A:
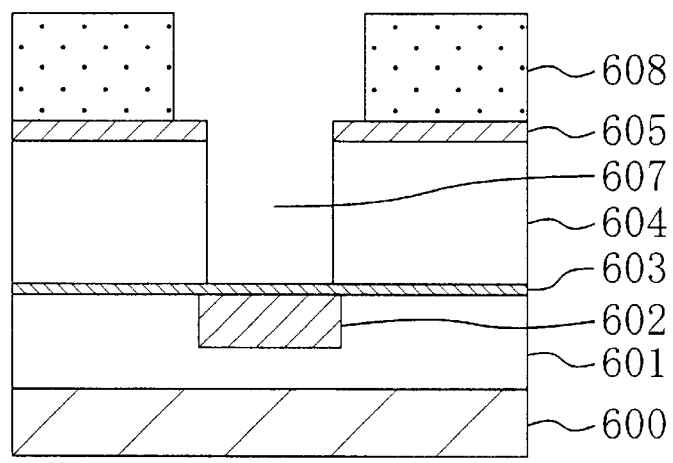
FIGS. 17(a) through 17(c) are cross-sectional views of process steps of the fabricating method for a semiconductor device of the seventh embodiment of the present invention.
Figure 17B:
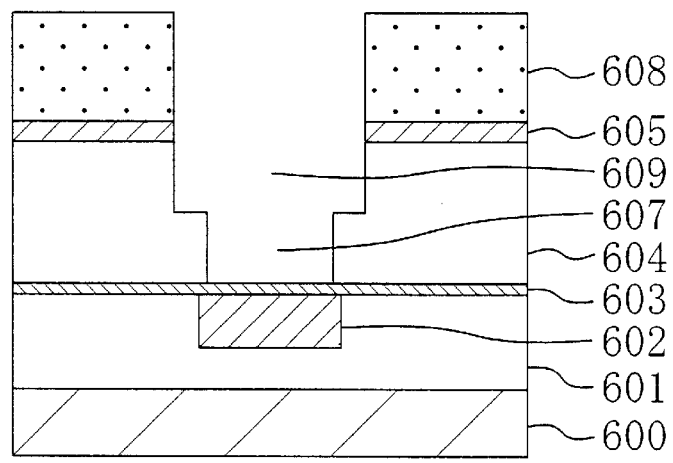
Figure 17C:
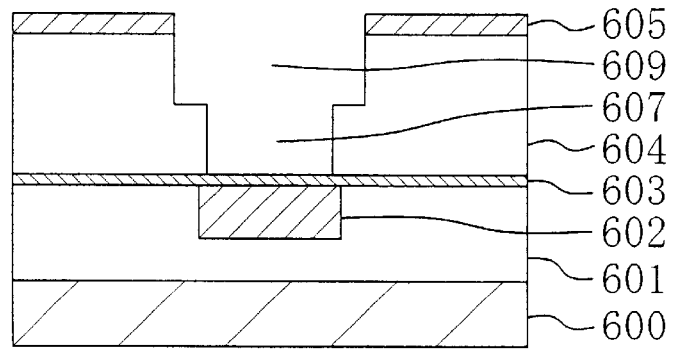
Figure 18A:
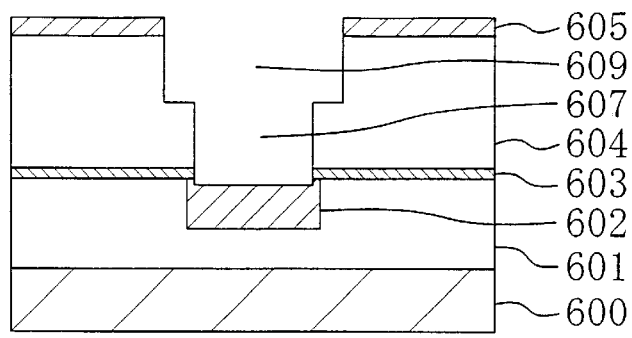
FIGS. 18(a) through 18(d) are cross-sectional views of process steps of the fabricating method for a semiconductor device of the seventh embodiment of the present invention.
Figure 18B:
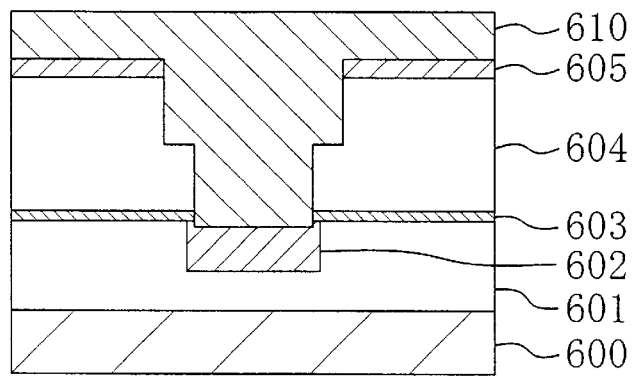
Figure 18C:
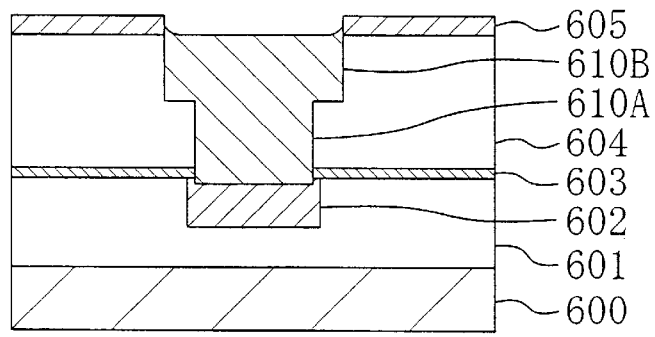
Figure 18D:
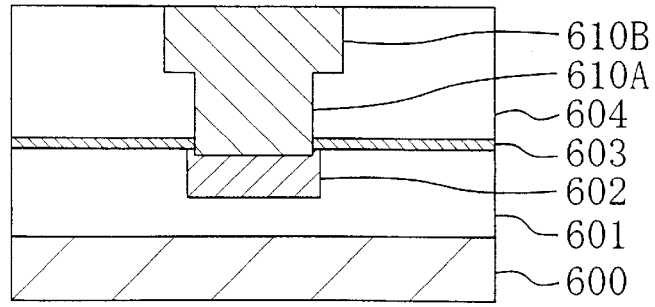

After the first resist pattern 606 is removed as shown in FIG. 16(*c*), a second resist pattern 608 having openings for formation of interconnection grooves is formed on the CMP stopper film 605 as shown in FIG. 17(*a*).

Using the second resist pattern 608 as a mask, the CMP stopper film 605 and then the interlayer insulating film 604 are sequentially etched, to form an interconnection groove 609 communicating with the contact hole 607 in the interlayer insulating film 604 as shown in FIG. 17(*b*). The conditions for the etching for formation of the interconnection groove 609 in the interlayer insulating film 604 are the same as those for formation of the contact hole 607 through the interlayer insulating film 604.

After the second resist pattern 608 is removed as shown in FIG. 17(*c*), the portion of the etching stopper film 603 exposed in the contact hole 607 is removed as shown in FIG. 18(*a*).

Referring to FIG. 18(*b*), a metal film 610 made of a copper film, a tungsten film, or the like is deposited on the entire surface of the CMP stopper film 605. The portion of the metal film 610 exposed on the CMP stopper film 605 is then removed by CMP, to form a plug 610A and an upper interconnection 610B made of the metal film 610 simultaneously as shown in FIG. 18(*c*).

Referring to FIG. 18(*d*), when the CMP stopper film 605 is removed by etching, the surface of the upper interconnection 610B is flat and flush with the surface of the interlayer insulating film 604.

In the seventh embodiment, the contact hole 607 and the interconnection groove 609 can be reliably formed in the interlayer insulating film 604 made of an organic/inorganic hybrid film having a low specific dielectric constant. In addition, CMP can be performed nicely for the interlayer insulating film 604 made of an organic/inorganic hybrid film considered poor in CMP resistance, because the interlayer insulating film 604 is protected with the CMP stopper film 605 during the CMP process.

Moreover, the etching stopper film 603 made of the organic/inorganic hybrid film having a larger proportion of the carbon component is formed under the interlayer insulating film 604. This etching stopper film 603, which serves as the etching stopper for the interlayer insulating film 604, is significantly small in specific dielectric constant compared with the conventional etching stopper film made of a silicon nitride film.

(Eighth Embodiment)

A semiconductor device and a fabricating method therefor of the eighth embodiment will be described with references to FIGS. 19(a) to 19(c) and 20(a) to 20(c).

First, a lower interconnection 702 made of a copper film, an alloy film of copper as a main component, or the like is embedded in an insulating film 701 deposited on a semiconductor substrate 700. An etching stopper film 703 having a thickness of 50 nm is then deposited on the entire surface of the lower interconnection 702. The etching stopper film 703 is made of an insulating film represented by $SiC_xH_yO_z$ (x>0, y≧0, z>0) in which the proportion of the carbon component is relatively large.

Subsequently, an interlayer insulating film 704 is deposited on the etching stopper film 703 by plasma CVD, for example. The interlayer insulating film 704 is made of an organic/inorganic hybrid film represented by $SiC_xH_yO_z$ (x>0, y≧0, z>0) in which the proportion of the carbon component is relatively small.

As the film formation gas for deposition of the etching stopper film 703 and the interlayer insulating film 704, usable is a mixed gas of a material gas such as tetramethylsilane ($Si(CH_3)_4$), dimethyl.dimethylsiloxane ($Si(CH_3)_2$(—O—$CH_3)_2$), monomethylsilane ($SiH_3(CH_3)$), or Hexamethyldisiloxane ($Si(CH_3)_3$—O—$Si(CH_3)_3$) and an additive gas such as $N_2O$.

The proportion of the carbon component in the etching stopper film 703 can be made larger than that in the interlayer insulating film 704 in the following manner, for example. The same kind of the material gas (for example, HMDSO) is used as the main component. The proportion of the additive gas (for example $N_2O$) contained in the film formation gas for deposition of the etching stopper film 703 is reduced, while the proportion of the additive gas contained in the film formation gas for deposition of the interlayer insulating film 704 is increased. Alternatively, a film formation gas including a material gas containing an increased amount of the carbon component may be used for deposition of the etching stopper film 703, while a film formation gas including a material gas containing a reduced amount of the carbon component may be used for deposition of the interlayer insulating film 704.

Thereafter, a silicon oxide film 705 containing no carbon component, such as a TEOS film, having a thickness of 5 nm to 10 nm is deposited on the interlayer insulating film 704 by plasma CVD, for example. A positive chemical amplification resist material is then applied to the silicon oxide film 705, to form a resist film 706.

The resist film 706 is then patterned by being exposed to light via a mask 707. By this pattern exposure, an exposed portion 706a of the resist film 706 is made soluble to a developer by the function of acid generated from an acid generator, while non-exposed portions 706b of the resist film 706 remain hard to dissolve in the developer without generation of acid from an acid generator. During this process, with the existence of the silicon oxide film 705 containing no carbon component interposed between the resist film 706 and the interlayer insulating film 704, acid ($H^+$) generated in the exposed portion 706a of the resist film 706 is prevented from reacting with a carbon component (C) contained in the interlayer insulating film 704, and thus is not deactivated. It is therefore ensured that the exposed portion 706a is made soluble to the developer by the function of acid.

Thereafter, as shown in FIG. 19(b), the exposed portion 706a of the resist film 706 is removed by being dissolved in the developer, to form a first resist pattern 708 that is composed of the non-exposed portions 706b of the resist film 706 and has openings for formation of contact holes. Since the exposed portion 706a of the resist film 706 has been made soluble to the developer without deactivation of acid as described above, the resultant first resist pattern 708 is excellent in resolution.

Referring to FIG. 19(c), the opening of the first resist pattern 708 is transferred to the silicon oxide film 705, and then the interlayer insulating film 704 is plasma-etched using the first resist pattern 708 as a mask, to form a contact hole 709 through the interlayer insulating film 704.

The conditions of this plasma etching are substantially the same as those used in the first embodiment. That is, the etching gas containing fluorine, carbon and nitrogen is fed into the reaction chamber, and high-frequency power is applied to the plasma induction coil to generate plasma of the etching gas.

Under the above-conditions, the etching proceeds in the following manner. The etching species such as $N_2$ contained in the plasma react with carbon atoms or hydrogen atoms existing on the bottom of a contact hole 709 to reform the bottom during the etching. Therefore, the bottom of the contact hole 709 is nicely etched with the etching species such as $CF_x$ contained in the plasma.

Figure 20C:
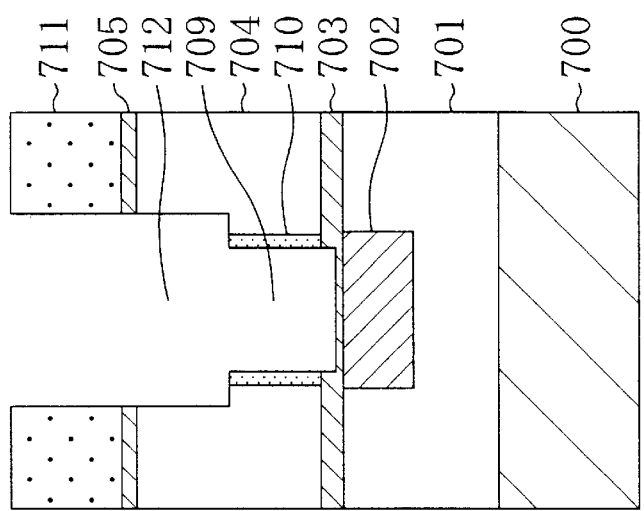
FIGS. 20(a) through 20(c) are cross-sectional views of process steps of the fabricating method for a semiconductor device of the eighth embodiment of the present invention.
Figure 20B:
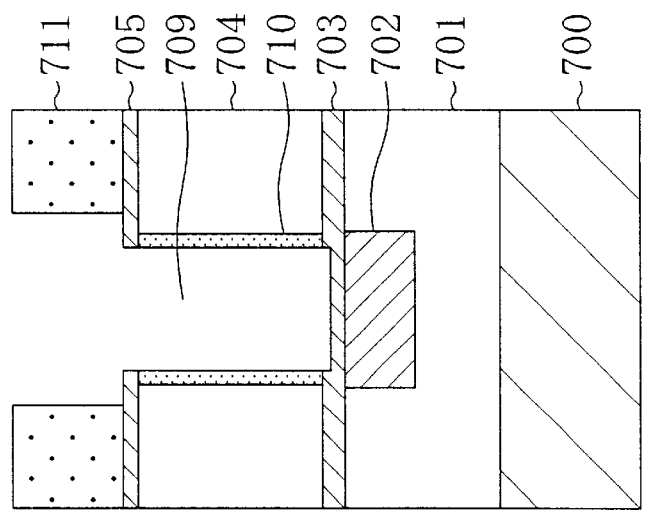
Figure 20A:
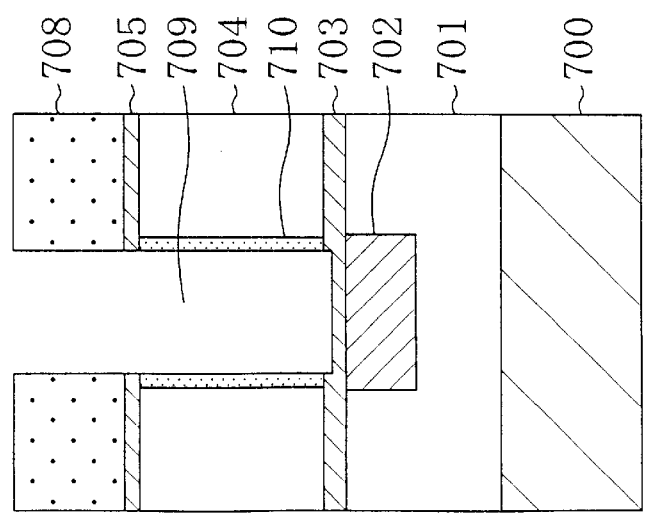

Referring to FIG. 20(a), before or after removal of the resist pattern 708 with oxygen plasma, the wall of the contact hole 709 is exposed to a nitrogen-containing gas or a gas containing fluoride, carbon and nitrogen, to form a reformed layer 710 on the wall of the contact hole 709 by eliminating the carbon component from the organic/inorganic hybrid film.

Referring to FIG. 20(b), after the removal of the first resist pattern 708, a second resist pattern 711 made of a chemical amplification resist material having openings for formation of interconnection grooves is formed on the silicon oxide film 705. With the existence of the silicon oxide film 705 having no carbon component interposed between the chemical amplification resist film and the interlayer insulating film 704, and the formation of the reformed layer 710 containing no carbon component on the wall of the contact hole 709, acid generated in an exposed portion of the resist film is prevented from being deactivated. Thus, the resultant second resist pattern 711 is excellent in resolution.

Referring to FIG. 20(c), the opening of the second resist pattern 711 is transferred to the silicon oxide film 705, and then the interlayer insulating film 704 is plasma-etched using the second resist pattern 711 as a mask, to form an interconnection groove 712 in the interlayer insulating film 704.

The conditions for the above etching are the same as those used in the first embodiment. That is, the etching gas containing fluorine, carbon and nitrogen is fed into the reaction chamber, and high-frequency power is applied to the plasma induction coil to generate plasma of the etching gas.

Under the above conditions, the etching proceeds in the following manner. The etching species such as $N_2$ contained in the plasma react with carbon atoms or hydrogen atoms existing on the bottom of the interconnection groove 712 to reform the bottom during the etching. Therefore, the bottom of the interconnection groove 712 is nicely etched with the etching species such as $CF_x$ contained in the plasma.

Thereafter, although illustration is omitted, the following processes are carried out as in the seventh embodiment. After removal of the second resist pattern 711, the portion of the etching stopper film 703 exposed in the contact hole 709 is removed. Before or after the removal of the resist pattern 711, the reformed layer 710 may be removed by oxide film etching. Thereafter, a metal film made of a copper film or a tungsten film is deposited on the entire surface of the silicon oxide film 705. The portion of the metal film exposed on the silicon oxide film 705 is then removed by CMP, to obtain multilayer interconnections having a dual damascene structure.

In the eighth embodiment, the resist film 706 made of a positive chemical amplification resist material was used. When a resist film made of a negative chemical amplification resist material is used, also, deactivation of acid in the exposed portion of the resist film can be prevented by interposing the silicon oxide film 705 containing no carbon component between the interlayer insulating film 704 and the negative resist film.

In the case that a reflection prevention film is provided by CVD at a position lower than the resist film 706 shown in FIG. 19(*a*), it is preferable to form the reflection prevention film on the interlayer insulating film 704 and then the silicon oxide film 705 on the reflection prevention film. By this structure, it is possible to prevent deactivation of acid in the resist film 706 caused due to the existence of the reflection prevention film based on a mechanism, different from that in the case of the organic/inorganic hybrid film, that works when the underlying layer is an alkaline film or a film other than the organic/inorganic hybrid film that easily binds with $H^+$.

(First Modification of the Eighth Embodiment)

In the eighth embodiment, the silicon oxide film 705 containing no carbon component was deposited on the interlayer insulating film 704 made of the organic/inorganic hybrid film. In the first modification of the eighth embodiment, the silicon oxide film 705 containing no carbon component is formed on the interlayer insulating film 704 by reforming the surface portion of the interlayer insulating film 704 made of the organic/inorganic hybrid film.

First, as in the eighth embodiment, the interlayer insulating film 704 made of the organic/inorganic hybrid film is deposited.

The interlayer insulating film 704 is then etched back with an etching gas containing fluorine and carbon. At the final stage of this etch-back process, an etching gas containing fluorine, carbon and nitrogen is fed and plasma is generated from the etching gas. The etching species such as $N_2$ contained in the plasma are attracted to the surface portion of the interlayer insulating film 704 and react with carbon atoms or hydrogen atoms existing on the surface portion. Thus, the surface portion of the interlayer insulating film 704 is reformed by the elimination of the carbon component, forming the silicon oxide film 705.

Thereafter, a chemical amplification resist material is applied to the silicon oxide film 705 formed on the interlayer insulating film 704, to form the resist film 706, as in the eighth embodiment. The resist film 706 is then subjected to pattern exposure, and the exposed portion 706*a* of the resist film 706 is removed with a developer, to form the first resist pattern 708.

By the above method, the silicon oxide film 705 containing no carbon component exists between the resist film 706 and the interlayer insulating film 704. Therefore, as in the eighth embodiment, deactivation of acid generated in the exposed portion 706*a* of the resist film 706 is prevented. It is therefore ensured that the exposed portion 706*a* is made soluble to the developer by the function of acid.

(Second Modification of the Eighth Embodiment)

A semiconductor device and a fabricating method therefor of the second modification of the eighth embodiment will be described with reference to FIGS. 21(*a*) to 21(*c*).

First, as in the eighth embodiment, the interlayer insulating film 704 is plasma-etched using the first resist pattern 708 as a mask, to form the contact hole 709 through the interlayer insulating film 704 (see FIG. 19(*c*)). The reformed layer 710 is then formed as shown in FIG. 20(*a*). Thereafter, the first resist pattern 708 is removed by ashing with oxygen plasma.

Thereafter, a chemical amplification resist material is applied to the silicon oxide film 705, to form a resist film. The resist film is then subjected to pattern exposure and development, to form the second resist pattern 711 having openings for formation of interconnection grooves as shown in FIG. 21(*a*). During this process, the chemical amplification resist material is also deposited in the contact hole 709. In the resist film deposited in the contact hole 709, acid generated due to the pattern exposure is deactivated by the carbon component from the etching stopper film 703. Therefore, the resist film on the bottom of the contact hole 709 is left behind after the removal of the exposed portion of the resist film with the developer, forming a protection film 711*a* made of the chemical amplification resist material in which acid has been deactivated.

Figures 21A, 21B, 21C:
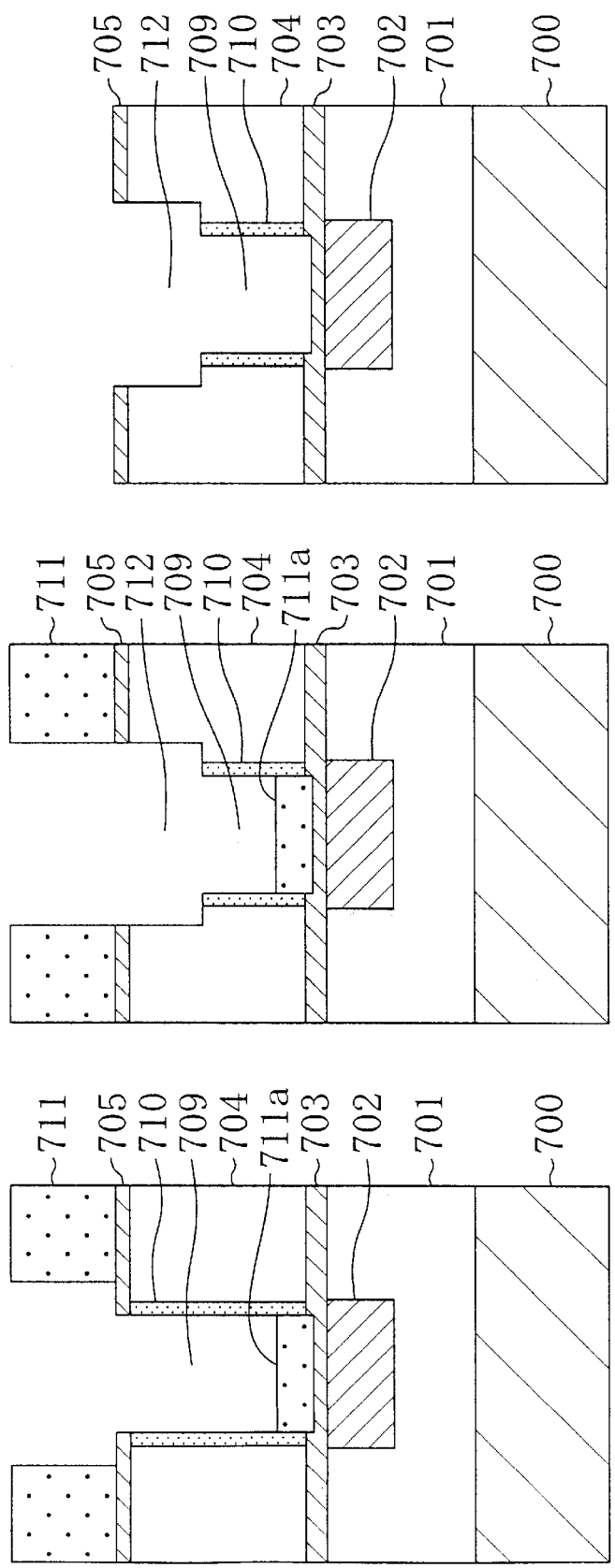
FIGS. 21(a) through 21(c) are cross-sectional views of process steps of a fabricating method for a semiconductor device of the second modification of the eighth embodiment of the present invention.
Figure 22A:
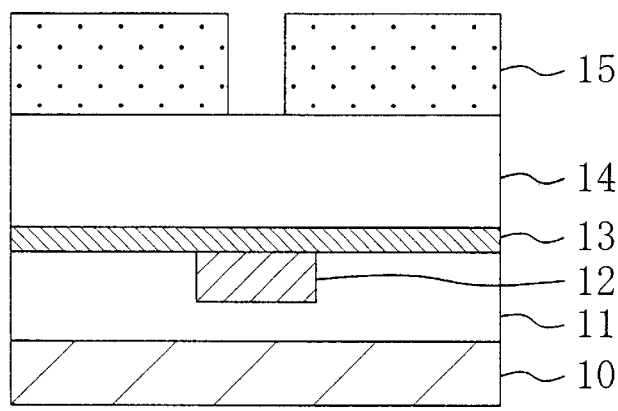
FIGS. 22(a) through 22(d) are cross-sectional views of process steps of the first conventional fabricating method for a semiconductor device.
Figure 22B:
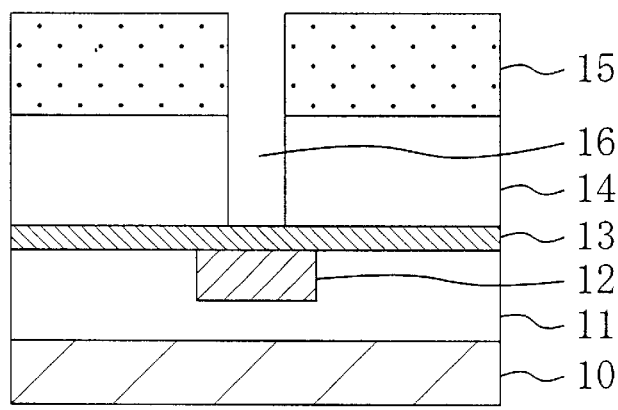
Figure 22C:
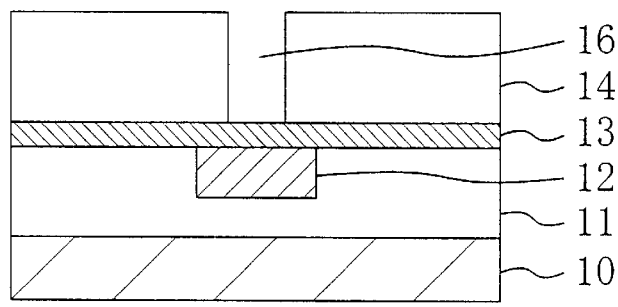
Figure 22D:
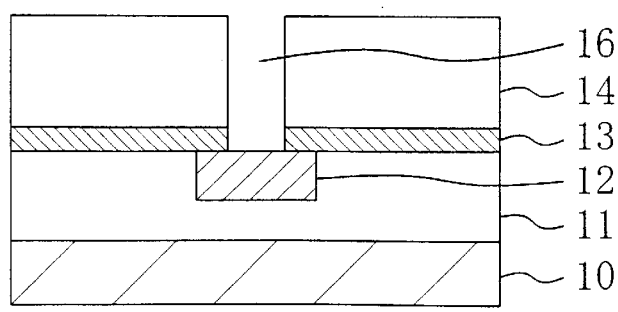
Figure 23A:
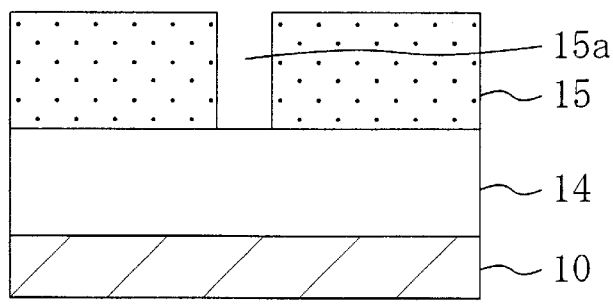
FIGS. 23(a) through 23(d) are cross-sectional views of process steps of the second conventional fabricating method for a semiconductor device.
Figure 23B:
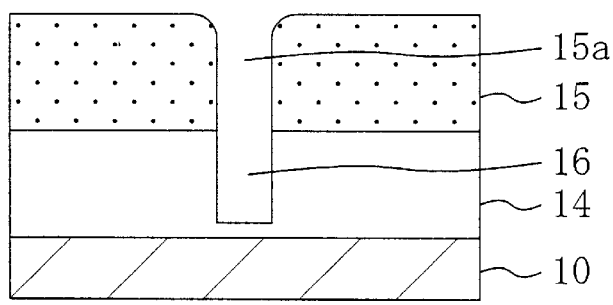
Figure 23C:
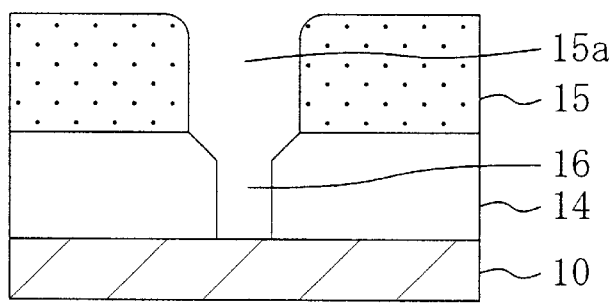
Figure 23D:
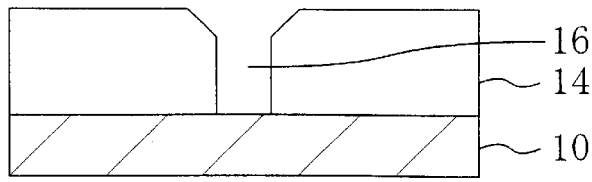
Figure 24A:
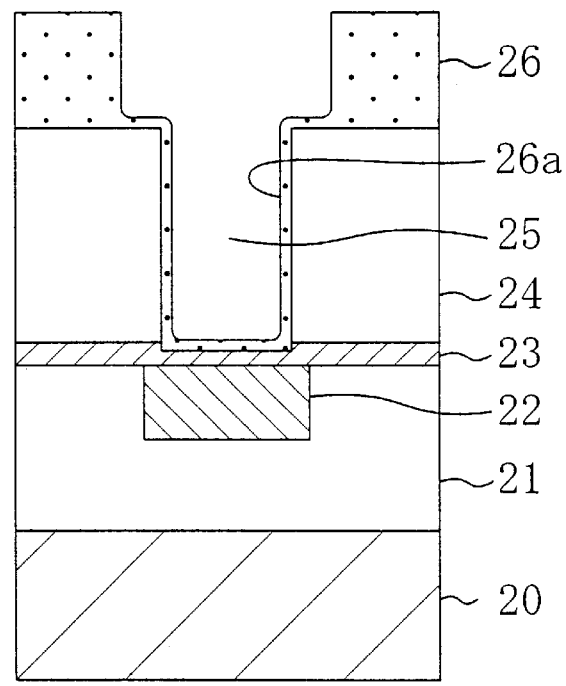
FIGS. 24(a) and 24(b) are cross-sectional views for description of a problem occurring when a chemical amplification resist film is formed on an interlayer insulating film made of an organic/inorganic hybrid film.
Figure 24B:
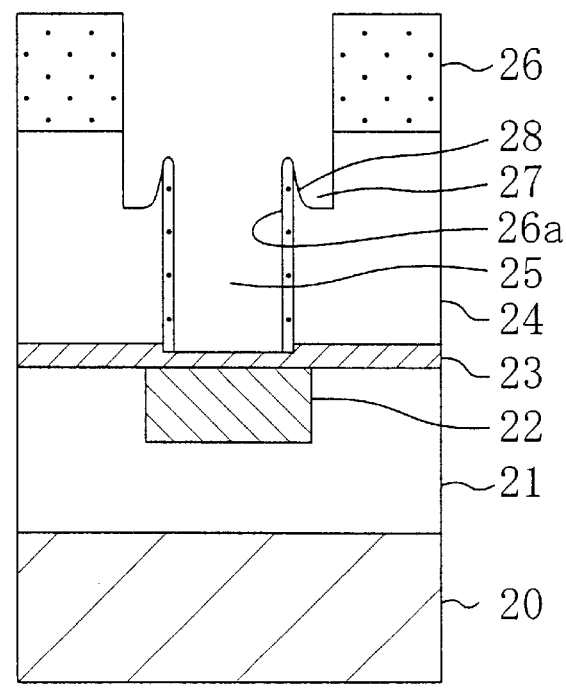
Figure 25:
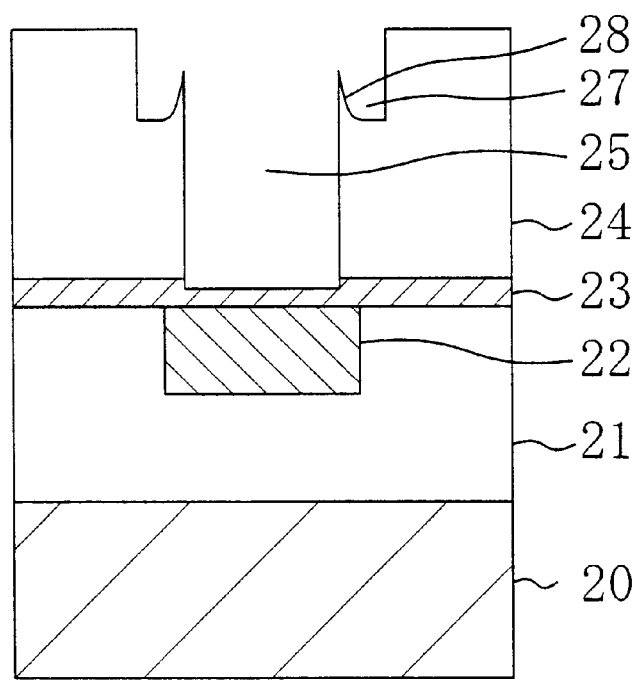
FIG. 25 is a cross-sectional view for description of the problem occurring when a chemical amplification resist film is formed on an interlayer insulating film made of an organic/inorganic hybrid film.
Figure 26A:
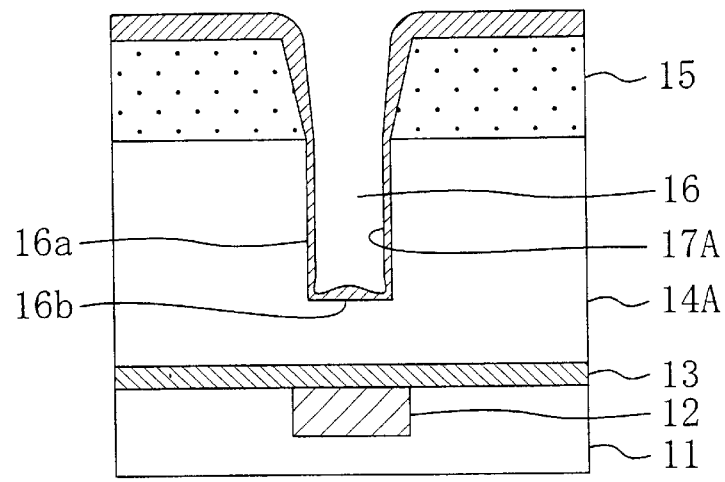
FIG. 26(a) is a cross-sectional view of a contact hole formed by dry-etching an interlayer insulating film made of a silicon oxide film with an etching gas containing fluorine and carbon.
Figure 26B:
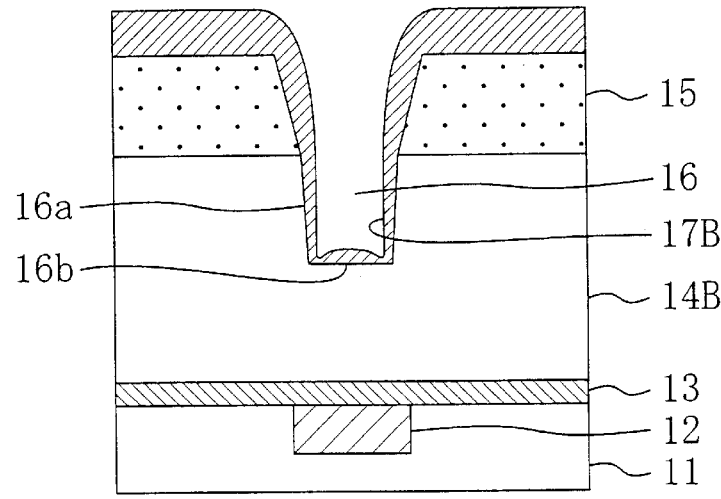
FIG. 26(b) is a cross-sectional view of a contact hole formed by dry-etching an interlayer insulating film made of an organic/inorganic hybrid film with an etching gas containing fluorine and carbon.

The opening of the second resist pattern 711 is transferred to the silicon oxide film 705, and then the interlayer insulating film 704 is plasma-etched using the second resist pattern 711 as a mask to form an interconnection groove 712 in the interlayer insulating film 704 as shown in FIG. 21(*b*).

The conditions for the above etching are the same as those used in the first embodiment. That is, the etching gas containing fluorine, carbon and nitrogen is fed into the reaction chamber, and high-frequency power is applied to the plasma induction coil to generate plasma of the etching gas. Under the above conditions, the etching proceeds in the following manner. The etching species such as $N_2$ contained in the plasma react with carbon atoms or hydrogen atoms existing on the bottom of the interconnection groove 712 to reform the bottom during the etching. Therefore, the bottom of the interconnection groove 712 is nicely etched with the etching species such as $CF_x$ contained in the plasma.

The interlayer insulating film 704 is subjected to two times of plasma etching, one for formation of the contact hole 709 and the other for formation of the interconnection groove 712. Therefore, the portion of the etching stopper film 703 exposed in the contact hole 709 may possibly be extremely thinned or even completely lost (see FIG. 20(*c*)). Therefore, during the ashing of the second resist pattern 711 with oxygen plasma, the lower interconnection 702 may be exposed to the oxygen plasma forming a naturally oxidized film on the surface of the lower interconnection 702. This may increase the contact resistance between the plug made of a conductive film filled in the contact hole 709 and the lower interconnection 702.

In the second modification of the eighth embodiment, the plasma etching for formation of the interconnection groove 712 is carried out with the protection film 711*a* made of the acid-deactivated chemical amplification resist material existing on the bottom of the contact hole 709. The etching stopper film 703 is therefore exposed to plasma etching only once, and thus the portion of the etching stopper film 703 exposed in the contact hole 709 is prevented from being excessively thinned.

For the above reason, as shown in FIG. 21(*c*), when the second resist pattern 711 is removed by ashing with oxygen plasma, the lower interconnection 702 is prevented from being exposed to the oxygen plasma. This prevents formation of a naturally oxidized film on the surface of the lower interconnection 702, and thus prevents increase in the contact resistance between the plug made of a conductive film filled in the contact hole 709 and the lower interconnection 702.

Moreover, since the etching stopper film 703 is exposed to plasma etching only once, the etching stopper film 703 having a small thickness can be used. Thus, a material that deactivates a resist, such as an organic/inorganic hybrid film, can be used as the etching stopper film 703. Since the thickness of the etching stopper film 703 can be small, also, the specific dielectric constant between the lower and upper interconnections can be reduced. In addition, the thickness of the interlayer insulating film can be reduced, and thus the variation in thickness can be minimized.

What is claimed is:

1. An etching method for plasma-etching an organic/inorganic hybrid film having low dielectric constant and represented by $SiC_xH_yO_z$ (x>0, y≧0, z>0), comprising the step of:

plasma-etching the organic/inorganic hybrid film while reforming a surface portion of the organic/inorganic hybrid film by eliminating a carbon component from the surface portion.

2. The etching method of claim 1, wherein the plasma etching is performed with an etching gas containing fluorine, carbon and nitrogen.

3. The etching method of claim 2, wherein the etching gas contains CO or $CO_2$.

4. The etching method of claim 1, wherein the relative dielectric constant of the organic/inorganic hybrid film is between 2 and 3.

5. The etching method of claim 1, wherein the proportion of carbon atoms in the organic/inorganic hybrid film is between 17 wt % and 31 wt %.

6. The etching method of claim 1, wherein the step of plasma-etching includes a step of forming a contact hole or an interconnection groove in an interlayer insulating film composed of the organic/inorganic hybrid film.

7. An etching method for plasma-etching an organic/inorganic hybrid film having low dielectric constant and represented by $SiC_xH_yO_z$ (x>0, y≧0, z>0), comprising repeating alternately a first step of reforming a surface portion of the organic/inorganic hybrid film by eliminating a carbon compound from the surface portion and a second step of plasma-etching the surface portion from which the carbon compound has been eliminated.

8. The etching method of claim 7, wherein the first step is performed with a gas containing nitrogen, and the second step is performed with an etching gas containing fluorine and carbon.

9. The etching method of claim 8, wherein the gas containing nitrogen is a mixed gas of hydrogen and nitrogen or ammonia gas.

10. The etching method of claim 7, wherein the relative dielectric constant of the organic/inorganic hybrid film is between 2 and 3.

11. The etching method of claim 7, wherein the proportion of carbon atoms in the organic/inorganic hybrid film is between 17 wt % and 37 wt %.

12. The etching method of claim 7, wherein the step of plasma-etching includes a step of forming a contact hole or an interconnection groove in an interlayer insulating film composed of the organic/inorganic hybrid film.

13. A fabricating method for a semiconductor device, comprising the steps of:

depositing an etching stopper film represented by $SiC_xH_yO_z$ (x>0, y≧0, z≧0) on an interconnection layer formed on a substrate;

depositing an interlayer insulating film represented by $SiC_xH_yO_z$ (x>0, y≧0, z>0) on the etching stopper film; and forming a contact hole through the interlayer insulating film by plasma-etching the interlayer insulating film, wherein the portion of carbon atoms with respect to silicon atoms in the etching stopper film is larger than the proportion of carbon atoms with respect to silicon atoms in the interlayer insulating film.

14. The fabricating method for a semiconductor device of claim 13, wherein the plasma etching is performed with an etching gas containing fluorine, carbon and nitrogen.

15. A fabricating method for a semiconductor device, comprising the steps of:

depositing a first interlayer insulating film represented by $SiC_xH_yO_z$ (x<0, y≧0, z≧0) on an interconnection layer formed on a substrate;

depositing a second interlayer insulating film represented by $SiC_xH_yO_z$ (x>0, y≧0, z>0) on the etching stopper film; and plasma-etching the second interlayer insulating film and the first interlayer insulating film sequentially, to form a first opening through the second interlayer insulating film, the diameter of the first opening being smaller toward the bottom end, and a second opening through the first interlayer insulating film, the wall of the second opening being vertical to the bottom surface, wherein the proportion of carbon atoms with respect to silicon atoms in the first interlayer insulating film is smaller than the proportion of carbon atoms with respect to silicon atoms in the second interlaver insulating film.

16. The fabricating method for a semiconductor device of claim 15, wherein the plasma etching is performed with an etching gas containing fluorine, carbon and nitrogen.

17. A fabricating method for a semiconductor device, comprising the steps of:

depositing an interlayer insulating film represented by $SiC_xH_yO_z$ (x>0, y≧0, z>0) on a substrate;

performing first plasma-etching for the interlayer insulating film while blocking or suppressing a carbon component from being eliminated from a surface portion of the interlayer insulating film, to form a first opening in the interlayer insulating film, the diameter of the first opening being smaller toward the bottom end; and performing second plasma-etching for the interlayer insulating film while facilitating elimination of the carbon component from the surface portion of the interlayer insulating film, to form a second opening under the first opening in the interlayer insulating film, the wall of the first opening being vertical to the bottom surface.

18. The fabricating method for a semiconductor device of claim 17, wherein the first plasma-etching is performed with a first etching gas containing fluorine, carbon and nitrogen, and the second plasma-etching is performed with a second etching gas containing fluorine, carbon and nitrogen, wherein the proportion of nitrogen in the first etching gas is smaller than the proportion of nitrogen in the second etching gas.

19. A fabricating method for a semiconductor device, comprising the steps of:

depositing an interlayer insulating film represented by $SiC_xH_yO_z$ (x>0, y≧0, z>0) and composed of an organic/inorganic hybrid film having low dielectric constant on a substrate;

forming a silicon oxide film containing no carbon component on a top surface or a surface portion of the interlayer insulating film by reforming a surface portion of the interlayer insulating film;

forming a resist film made of a chemical amplification resist material on the silicon oxide film; and subjecting the resist film to pattern exposure and development to form a resist pattern made of the resist film.

20. A fabricating method for a semiconductor device of claim 19, wherein the silicon oxide film is formed by eliminating a carbon component from the surface portion of the interlayer insulating film.

21. A fabricating method for a semiconductor device, comprising the steps of:

depositing an etching stopper film on an interconnection layer formed on a substrate, and then depositing an interlayer insulating film represented by $SiC_xH_yO_z$ ($x>0$, $y \geq 0$, $z>0$) and composed of an organic/inorganic hybrid film having low dielectric constant on the etching stopper film;

forming a contact hole through the interlayer insulating film;

forming a resist pattern made of a chemical amplification resist material, the resist pattern having an opening for formation of an interconnection groove, and also forming a protection film made of the chemical amplification resist material on the bottom of the contact hole for protecting the etching stopper film; and plasma-etching the interlayer insulating film using the resist pattern, to form the interconnection groove in the interlayer insulating films, wherein the etching stopper film is composed of a material that deactivates the chemical amplification resist material.

22. A fabricating method for a semiconductor device, comprising the steps of:

depositing an etching stopper film represented by $SiC_xH_yO_z$ ($x>0$, $y \geq 0$, $z \geq 0$) on an interconnection layer formed on a substrate;

depositing an interlayer insulating film represented by $SiC_xH_yO_z$ ($x>0$, $y \geq 0$, $z>0$), on the etching stopper film;

depositing a CMP stopper film on the interlayer insulating film;

forming a resist pattern having an opening for formation of a contact hole on the CMP stopper film;

transferring the opening of the resist pattern to the CMP stopper film, and then plasma-etching the interlayer insulating film while eliminating a carbon component from a surface portion of the interlayer insulating film, to form a contact hole through the interlayer insulating film;

after removal of the resist pattern, depositing a conductive film on the CMP stopper film to fill the contact hole with the conductive film; and removing a portion of the conductive film exposed on the CMP stopper film by CMP, to form a plug made of the conductive films, wherein the proportion of carbon atoms with respect to silicon atoms in the etching stopper film is larger than the proportion of carbon atoms with respect to silicon atoms in the interlayer insulating film.

23. A fabricating method for a semiconductor device comprising the steps of:

depositing an etching stopper film represented by $SiC_xH_yO_z$ ($x>0$, $y \geq 0$, $z \geq 0$) on a lower interconnection formed on a substrate;

depositing an interlayer insulating film represented by $SiC_xH_yO_z$ ($x>0$, $y \geq 0$, $z>0$) on the etching stopper film;

depositing a CMP stopper film on the interlayer insulating film;

forming a first resist pattern having an opening for formation of a contact hole on the CMP stopper film;

transferring the opening of the first resist pattern to the CMP stopper film, and then plasma-etching the interlayer insulating film while eliminating a carbon component from a surface portion of the interlayer insulating film, to form the contact hole through the interlayer insulating film;

after removal of the first resist pattern, forming a second resist pattern having an opening for formation of an interconnection groove on the CMP stopper film; transferring the opening of the second resist pattern to the CMP stopper film, and then plasma-etching the interlayer insulating film while eliminating a carbon component from a surface portion of the interlayer insulating film, to form the interconnection groove in the interlayer insulating film;

depositing a conductive film on the CMP stopper film to fill the contact hole and the interconnection groove with the conductive film; and removing a portion of the conductive film exposed on the CMP stopper film by CMP, to form a plug and an upper interconnection made of the conductive film;

wherein the proportion of carbon atoms with respect to silicon atoms in the etching stopper film is larger than the proportion of carbon atoms with respect to silicon atoms in the interlayer insulating film.

* * * * *